US012787592B2

(12) United States Patent
Joo et al.

(10) Patent No.: US 12,787,592 B2
(45) Date of Patent: Nov. 3, 2026

(54) DISPLAY APPARATUS

(71) Applicant: Samsung Display Co., LTD., Yongin-si (KR)

(72) Inventors: Sunkyu Joo, Yongin-si (KR); Keunchan Oh, Yongin-si (KR); Sunyoung Kwon, Yongin-si (KR); Sangji Park, Yongin-si (KR); Jaecheol Park, Yongin-si (KR); Dokyung Youn, Yongin-si (KR); Songee Lee, Yongin-si (KR); Wooman Ji, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 446 days.

(21) Appl. No.: 18/352,986

(22) Filed: Jul. 14, 2023

(65) Prior Publication Data

US 2024/0155906 A1 May 9, 2024

(30) Foreign Application Priority Data

Nov. 9, 2022 (KR) ........................ 10-2022-0148970

(51) Int. Cl.
*H10K 59/80* (2023.01)
*H10K 59/38* (2023.01)

(52) U.S. Cl.
CPC ........... *H10K 59/38* (2023.02); *H10K 59/873* (2023.02); *H10K 59/879* (2023.02)

(58) Field of Classification Search
CPC .... H10K 59/38; H10K 59/879; H10K 59/873; H10K 59/122; H10K 59/875
See application file for complete search history.

(56) References Cited

U.S. PATENT DOCUMENTS

| | | | | |
|---|---|---|---|---|
| 9,680,054 | B2 | 6/2017 | Coe-Sullivan et al. | |
| 10,725,333 | B2 | 7/2020 | Kim et al. | |
| 10,950,667 | B2 | 3/2021 | Joo et al. | |
| 2017/0153525 | A1* | 6/2017 | Lim | G02F 1/133305 |
| 2018/0356677 | A1* | 12/2018 | Kim | H10D 86/421 |
| 2019/0025634 | A1* | 1/2019 | Park | G02F 1/133377 |
| 2019/0113799 | A1* | 4/2019 | Shin | H10D 86/60 |
| 2019/0377233 | A1* | 12/2019 | Park | G02F 1/136286 |

(Continued)

FOREIGN PATENT DOCUMENTS

| | | | |
|---|---|---|---|
| KR | 10-2018-0092326 | A | 8/2018 |
| KR | 10-2020-0111325 | A | 9/2020 |

(Continued)

*Primary Examiner* — Fatima N Farokhrooz
(74) *Attorney, Agent, or Firm* — Womble Bond Dickinson (US) LLP

(57) ABSTRACT

Provided is a display apparatus including a lower substrate, a light-emitting device over the lower substrate, an upper substrate over the lower substrate with the light-emitting device therebetween and including a central area overlapping the light-emitting device and a peripheral area outside the central area, a first bank over the upper substrate facing the lower substrate and defining a first opening and a second opening overlapping the central area, a refractive layer on the first bank, a transmission layer on the refractive layer and in the first opening, a quantum dot layer on the refractive layer and in the second opening, and a second bank over the first bank and the refractive layer and including the same material as the transmission layer.

20 Claims, 13 Drawing Sheets

(56) References Cited

U.S. PATENT DOCUMENTS

| | | | | |
|---|---|---|---|---|
| 2020/0326586 | A1* | 10/2020 | Kim | G02F 1/133516 |
| 2021/0005672 | A1* | 1/2021 | Lee | G02B 5/201 |
| 2021/0359011 | A1* | 11/2021 | Lee | H10K 59/8792 |
| 2021/0376291 | A1* | 12/2021 | Park | H10K 50/844 |
| 2021/0384283 | A1* | 12/2021 | Jung | H10K 59/131 |
| 2022/0003909 | A1 | 1/2022 | Song et al. | |
| 2022/0123183 | A1* | 4/2022 | Kim | H10H 29/8511 |
| 2022/0157893 | A1* | 5/2022 | Baek | H10K 59/873 |
| 2022/0352242 | A1* | 11/2022 | Park | H10H 29/142 |

FOREIGN PATENT DOCUMENTS

| | | | | |
|---|---|---|---|---|
| KR | 10-2020-0120793 | A | 10/2020 | |
| KR | 10-2022-0004872 | A | 1/2022 | |
| KR | 10-2022-0065919 | A | 5/2022 | |
| KR | 10-2022-0088545 | A | 6/2022 | |
| WO | WO-2022131568 | A1 * | 6/2022 | H10K 59/8792 |

* cited by examiner

DISPLAY APPARATUS

CROSS-REFERENCE TO RELATED APPLICATION

This application claims priority to and the benefit of Korean Patent Application No. 10-2022-0148970, filed on Nov. 9, 2022, in the Korean Intellectual Property Office, the entire content of which is incorporated by reference herein in its entirety.

BACKGROUND

1. Field

One or more embodiments of the present disclosure relate to a display apparatus.

2. Description of the Related Art

Display apparatuses may visually display data. The display apparatus is used as a display unit for small products such as mobile phones, or as a display unit for large products such as television.

The display apparatus may include a plurality of sub-pixels that receive and emit electrical signals to display an image on the outside. For a full-color display apparatus, the plurality of sub-pixels may emit light of different colors. To this end, at least some of the plurality of sub-pixels may include a filter unit configured to convert colors. Light of a first wavelength band generated by some sub-pixels is converted into light of a second wavelength band while passing through the corresponding filter unit, and then is extracted (e.g., transmitted) to the outside.

The full-color display apparatus may include an emission panel including a light-emitting device that emits light and a color panel including a filter unit configured to convert the color of light emitted from the light-emitting device, and a filling layer may be between the emission panel and the color panel.

SUMMARY

One or more embodiments of the present disclosure include a display apparatus having improved light efficiency and in which a vivid color is emitted from each sub-pixel. However, these features are merely examples and the scope of the disclosure is not limited thereto.

Additional aspects of embodiments will be set forth in part in the description which follows and, in part, will be apparent from the description, or may be learned by practice of the presented embodiments of the disclosure.

According to one or more embodiments, a display apparatus may include a lower substrate, a light-emitting device over the lower substrate, an upper substrate over the lower substrate with the light-emitting device therebetween and including a central area overlapping the light-emitting device and a peripheral area outside the central area, a first bank over the upper substrate facing the lower substrate and defining a first opening and a second opening overlapping the central area, a refractive layer on the first bank, a transmission layer on the refractive layer and in the first opening, a quantum dot layer on the refractive layer and in the second opening, and a second bank over the first bank and the refractive layer and including the same material as the transmission layer.

According to one or more embodiments, the transmission layer and the second bank may be integrally provided as a single body.

According to one or more embodiments, the first bank may include a first-first portion in the peripheral area and a first-second portion in the peripheral area, the first-second portion being thicker than the first-first portion.

According to one or more embodiments, the second bank may be in the peripheral area and may include a second-first portion overlapping the first-first portion of the first bank and a second-second portion overlapping the first-second portion of the first bank, and a vertical distance from the lower surface of the upper substrate to a lower surface of the second-second portion may be greater than a vertical distance from the lower surface of the upper substrate to a lower surface of the second-first portion.

According to one or more embodiments, the refractive layer may be in contact with each of a lower surface and a side of the first bank.

According to one or more embodiments, a third opening overlapping the peripheral area may be defined in the first bank.

According to one more embodiments, a fourth opening and a fifth opening overlapping the central area may be defined in the second bank, the fourth opening may correspond to the first opening of the first bank, and the fifth opening may correspond to the second opening of the first bank.

According to one or more embodiments, a sixth opening overlapping the peripheral area may be defined in the second bank, and the sixth opening may correspond to the third opening of the first bank.

According to one or more embodiments, the display apparatus may further include a material layer over the refractive layer and in the third opening of the first bank, wherein the material layer may include the same material as the second bank.

According to one or more embodiments, the second bank may include a liquid repellent material.

According to one or more embodiments, the display apparatus may further include a first capping layer between the refractive layer and the transmission and quantum dot layers.

According to one or more embodiments, the display apparatus may further include a second capping layer on the transmission layer, the quantum dot layer, and the second bank.

According to one or more embodiments, the display apparatus may further include an encapsulation layer covering the light-emitting device, and a filling layer between the encapsulation layer and the second bank, wherein the second-second portion of the second bank separates the encapsulation layer and the second-first portion and penetrates through the filling layer.

According to one or more embodiments, the display apparatus may include a lower substrate, a light-emitting device on the lower substrate, an upper substrate over the lower substrate with the light-emitting device therebetween and including a central area overlapping the light-emitting device and a peripheral area outside the central area, a first bank over the upper substrate facing the lower substrate and defining a first opening and a second opening overlapping the central area, a refractive layer on the first bank, a transmission layer on the refractive layer and in the first opening, a quantum dot layer on the refractive layer and in the second opening, and a first bank and a second bank on the refractive layer, wherein the first bank includes a first-first portion in the peripheral area and a first-second portion in the peripheral area, the first-second portion being thicker than the first-first portion.

According to one or more embodiments, the second bank may be in the peripheral area and may include a second-first portion overlapping the first-first portion of the first bank and a second-second portion overlapping the first-second portion of the first bank, and a vertical distance from the lower surface of the upper substrate to a lower surface of the second-second portion may be greater than a vertical distance from the lower surface of the upper substrate to a lower surface of the second-first portion.

According to one or more embodiments, the second bank may include the same material as the transmission layer.

According to one or more embodiments, the transmission layer and the second bank may be integrally provided as a single body.

According to one or more embodiments, a third opening overlapping the peripheral area may be defined in the first bank.

According to one or more embodiments, the display apparatus may further include a material layer over the refractive layer and in the third opening of the first bank, wherein the material layer may include the same material as the second bank.

According to one or more embodiments, the material layer and the second bank may be integrally provided as a single body.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
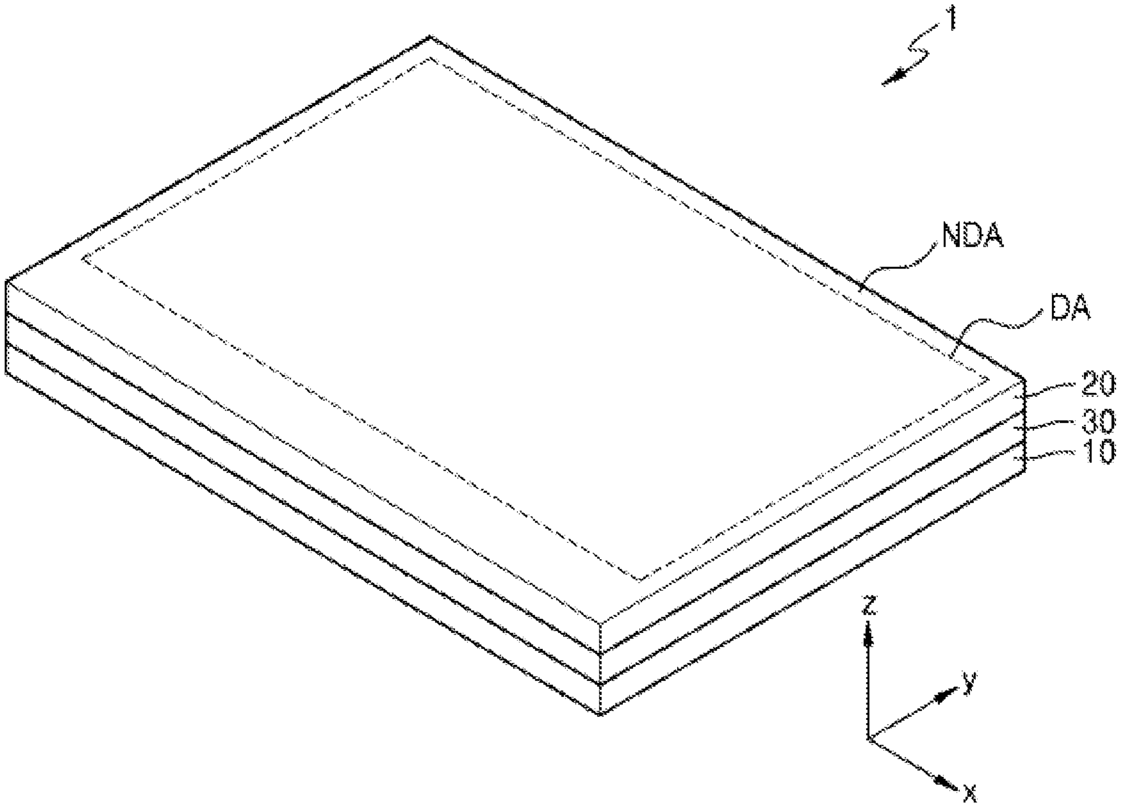
FIG. 1 is a schematic perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in more detail. The effects and features of the disclosure and the accomplishing methods thereof will become apparent from the embodiments described below in more detail with reference to the accompanying drawings. However, the disclosure is not limited to the embodiments described below and may be embodied in various modes.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

In the following embodiments, the expression "A and/or B" indicates only A, only B, or both A and B. Also, in the following embodiments, the expression "at least one of A and B" indicates only A, only B, or both A and B.

In the following embodiments, the expression "a line extends in a first direction or a second direction" may include a case in which "a line extends in a linear shape" (e.g., in a straight line) and a case in which "a line extends in a zigzag or curved shape in a first direction or a second direction."

In the following embodiments, the term "in a plan view" means seeing a target portion from above, and the term "in a cross-sectional view" means seeing a vertically cut cross-section of a target portion from side. In the following embodiments, when elements "overlap" each other, the elements overlap "on a plane" and "a cross-section."

Example embodiments will now be described more fully with reference to the accompanying drawings. When describing embodiments with reference to the accompanying drawings, the same or corresponding elements are denoted by the same reference numerals.

FIG. 1 is a schematic perspective view of a display apparatus according to an embodiment.

Referring to FIG. 1, the display apparatus 1 may display an image. The display apparatus 1 may provide an image through a plurality of sub-pixels in the display area DA. Each sub-pixel of the display apparatus 1 may be an area from which light of a certain color may be emitted. The display apparatus 1 may display the image by using light emitted from the plurality of sub-pixels. For example, the sub-pixel may emit red light, green light, or blue light. As another example, the sub-pixel may emit red light, green light, blue light, or white light.

A non-display area NDA may surround at least a portion of the display area DA2. In an embodiment, the non-display area NDA may entirely surround the display area DA. The non-display area NDA may be an area which does not provide an image.

The display area DA may have a polygonal shape including a square as shown in FIG. 1. For example, the display area DA may have a rectangular shape in which the horizontal length is greater than the vertical length, a rectangular shape in which the horizontal length is less than the vertical length, or a rectangular shape. In one or more embodiments, the display area DA may have a variety of suitable shapes, such as an oval or a circle.

In an embodiment, the display apparatus 1 may include an emission panel 10, a color panel 20, and a filling layer 30. The emission panel 10, the filling layer 30, and the color panel 20 may be stacked in a thickness direction (e.g., a z direction).

The display apparatus 1 of the above structure may be included in a mobile phone, a television, a billboard, a monitor, a tablet PC, a laptop, etc.

Figure 2:
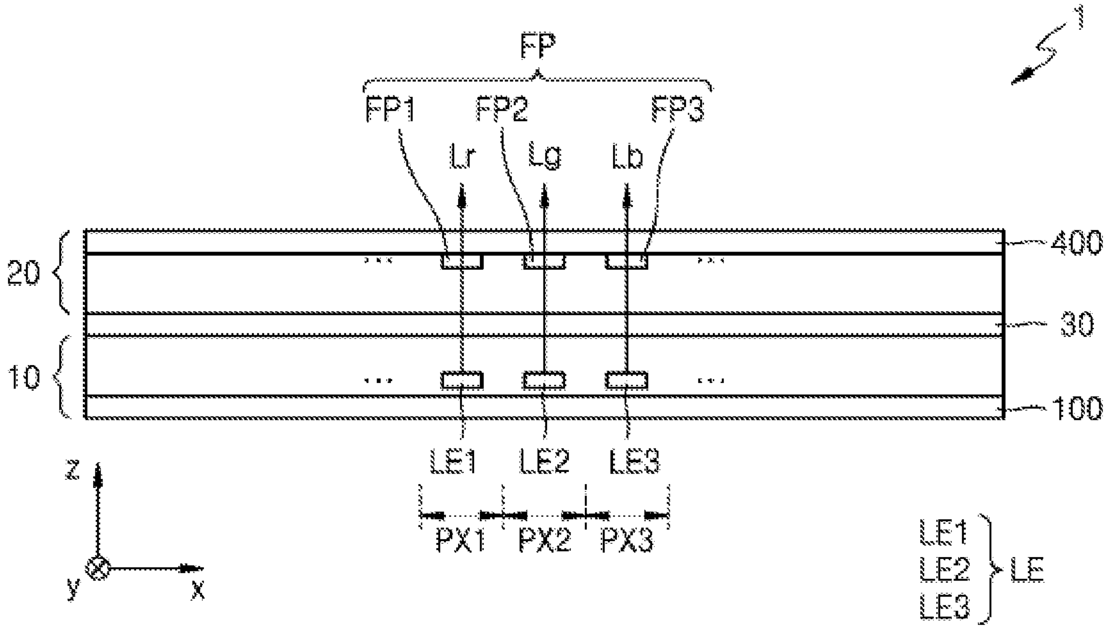
FIG. 2 is a schematic cross-sectional view of a display apparatus according to an embodiment.

Referring to FIG. 2, the display apparatus 1 may include a first sub-pixel PX1, a second sub-pixel PX2, and a third sub-pixel PX3. The first sub-pixel PX1, the second sub-pixel PX2, and the third sub-pixel PX3 may emit light of different colors from each other. For example, the first sub-pixel PX1 may emit red light Lr, the second sub-pixel PX2 may release green light Lg, and the third sub-pixel PX3 may emit blue light Lb.

The display apparatus 1 may include an emission panel 10, a color panel 20, and a filling layer 30. The emission panel 10 may include a lower substrate 100 and a light-emitting device LE. The light-emitting device may include an organic light-emitting device. In an embodiment, the first sub-pixel PX1, the second sub-pixel PX2, and the third sub-pixel PX3 may each include a light-emitting device LE. For example, the first sub-pixel PX1 may include a first light-emitting device LE1. The first light-emitting device LE1 may be a first organic light-emitting diode. The second sub-pixel PX2 may include a second light-emitting device LE2. The second light-emitting device LE2 may be a second organic light-emitting diode. The third sub-pixel PX3 may include a third light-emitting device LE3. The third light-emitting device LE3 may be a third organic light-emitting diode.

The first light-emitting device LE1, the second light-emitting device LE2, and the third light-emitting device LE3 may emit light of the same color as each other. In an embodiment, the first light-emitting device LE1, the second light-emitting device LE2, and the third light-emitting device LE3 may emit blue light.

The color panel 20 may include an upper substrate 400 and a filter unit FP. In an embodiment, the filter portion FP may include a first filter unit FP1, a second filter unit FP2, and a third filter unit FP3. Light emitted from the first light-emitting device LE1 may pass through the first filter unit FP1 to be emitted as red light Lr. Light emitted from the second light-emitting device LE2 may pass through the second filter unit FP2 to be emitted as green light Lg. Light emitted from the third light-emitting device LE3 may pass through the third filter unit FP3 to be emitted as blue light Lb.

The filter unit FP may include a functional layer and a color filter layer. In an embodiment, the functional layer may include a first quantum dot layer, a second quantum dot layer, and a transmission layer. In an embodiment, the color filter layer may include a first color filter, a second color filter, and a third color filter. The first filter unit FP1 may include the first quantum dot layer and the first color filter. The second filter unit FP2 may include the second quantum dot layer and the second color filter. The third filter unit FP3 may include the transmission layer and the third color filter.

The filter unit FP may be directly on the upper substrate 400. In this case, being "directly on the upper substrate" means that the first filter portion FP1, the second filter portion FP2, and the third filter portion FP3 are directly on the upper substrate 400 to form the color panel 20. Subsequently, the color panel 20 may be bonded to the emission panel 10 such that the first filter unit FP1, the second filter unit FP2, and the third filter unit FP3 may face the first light-emitting device LE1, the second light-emitting device LE2, and the third light-emitting device LE3, respectively.

The filling layer 30 may be between the emission panel 10 and the color panel 20. The filling layer 30 may bond the emission panel 10 to the color panel 20. In an embodiment, the filling layer 30 may include a thermocurable and/or photocurable filler. In one or more embodiments, either the emission panel 10 or the color panel 20 may include a column spacer. For example, the color panel 20 may include a column spacer protruding towards the emission panel 10. In another example, the emission panel 10 may include a column spacer protruding toward the color panel 20. Thus, a certain distance between each of the plurality of light-emitting devices LE and each of the plurality of filter units FP may be maintained.

Figure 3:
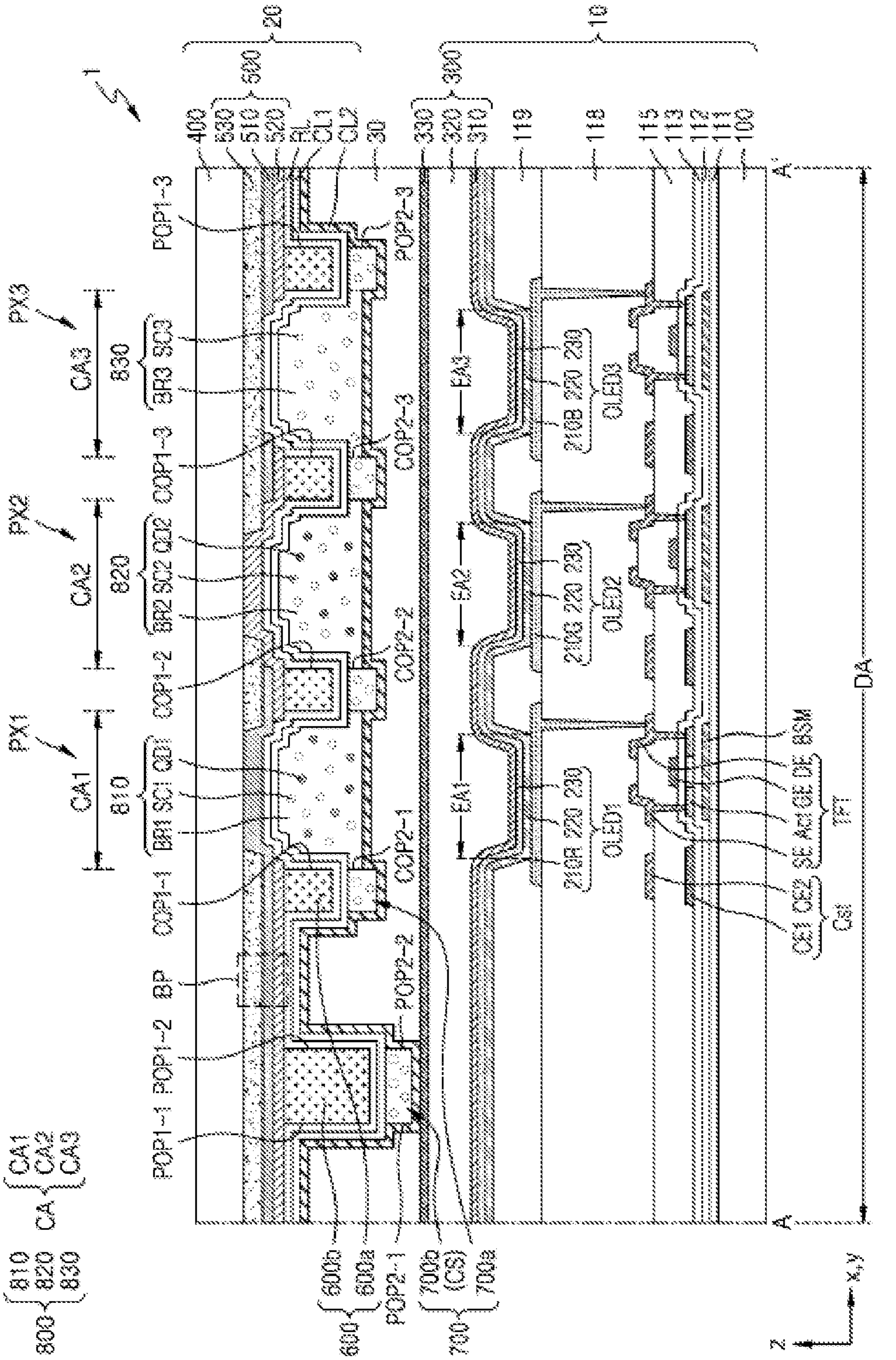
FIG. 3 is a schematic cross-sectional view of a portion of a display apparatus according to an embodiment.
Figure 4A:
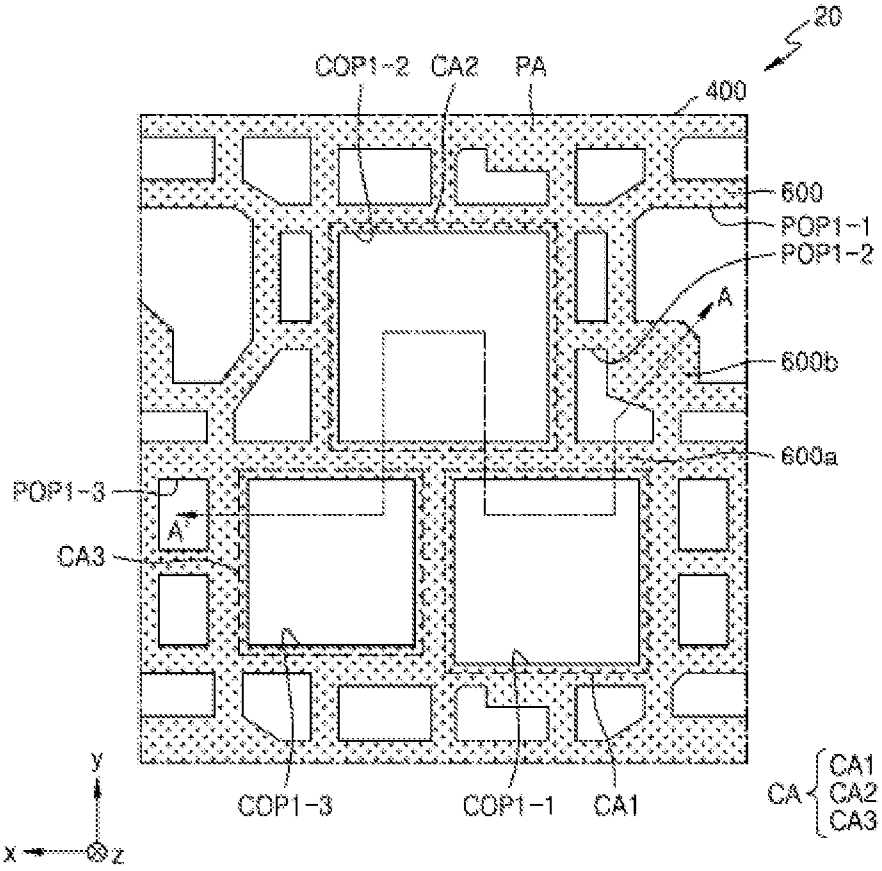
FIGS. 4A-4B are each a schematic plan view of a portion of the display apparatus of FIG. 3.
Figure 4B:
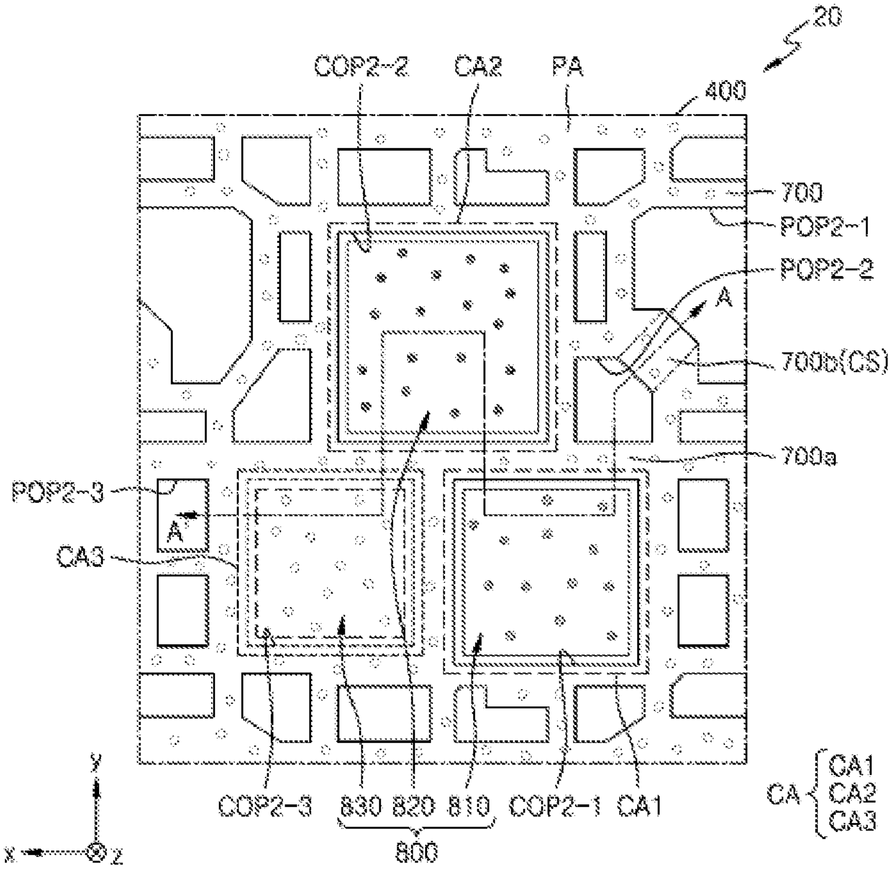
Figure 5:
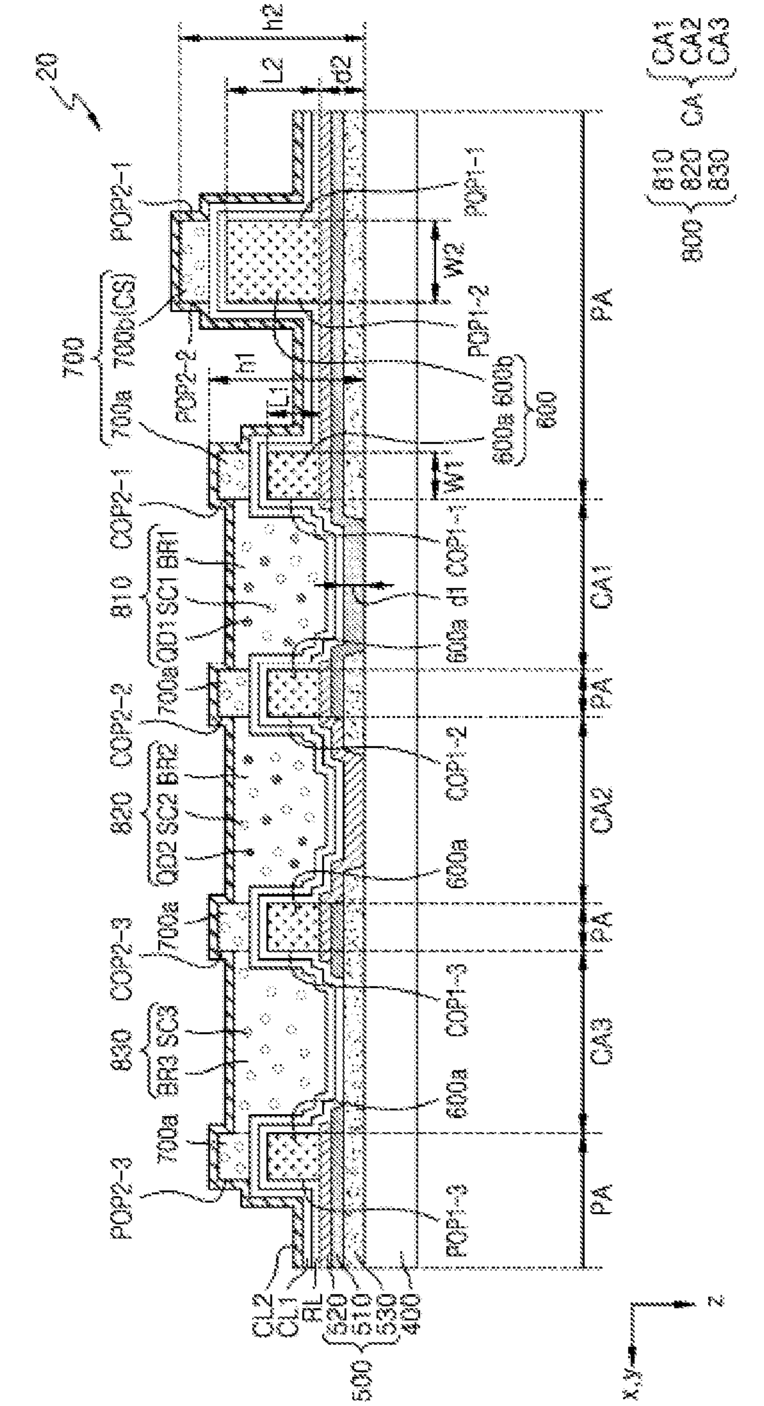
FIG. 5 is a schematic cross-sectional view of a portion of the display apparatus of FIG. 3.

FIG. 3 is a cross-sectional view schematically illustrating a portion of a display apparatus according to an embodiment. FIGS. 4A and 4B are a plan views illustrating a portion of the display apparatus of FIG. 3, and FIG. 3 may be understood as a cross-sectional view taken along line A-A' of FIGS. 4A and 4B. FIG. 4A is an excerpt of a first bank of the display apparatus from FIG. 3, and FIG. 4B is an excerpt of a second bank and a functional layer from FIG. 3. FIG. 5 is a cross-sectional view showing a portion of the display apparatus of FIG. 3 and shows the color panel of FIG. 3.

Referring to FIG. 3, the display apparatus 1 may include the emission panel 10, the color panel 20, and the filling layer 30. The emission panel 10 may include a lower substrate 100 and a light-emitting device on the lower substrate 100 and including an emission layer 220. The light-emitting device may be an organic light-emitting diode. In an embodiment, the emission panel 10 may include a first organic light-emitting diode OLED1, a second organic light-emitting diode OLED2, and a third organic light-emitting diode OLED3 that are on the lower substrate 100. The first organic light-emitting diode OLED1, the second organic light-emitting diode OLED2, and the third organic light-emitting diode OLED 3 may include the emission layer 220.

In the following description, a laminated structure of the emission panel 10 is described in more detail. In an embodiment, the emission panel 10 may include the lower substrate 100, a first buffer layer 111, a bias electrode BSM, a second buffer layer 112, a thin-film transistor TFT, a storage capacitor Cst, a gate insulating layer 113, an interlayer insulating layer 115, a planarization layer 118, the light-emitting device, and an encapsulation layer 300. The thin-film transistor TFT may include a semiconductor layer Act, a gate electrode GE, a source electrode SE, and a drain electrode DE. The storage capacitor Cst may include a first electrode CE1 and a second electrode CE2.

The lower substrate 100 may include a glass material, a ceramic material, a metal material, and/or a flexible and/or bendable material. When the display panel 10 is flexible and/or bendable, the lower substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The lower substrate 100 may have a single or multilayer structure of the material, and may further include an inorganic layer when having a multilayer structure. In an embodiment, the lower substrate 100 may have an organic/inorganic/organic structure.

A barrier layer may be further provided between the lower substrate 100 and the buffer layer 110. The barrier layer may prevent or reduce penetration of impurities from the lower substrate 100 and/or the like into the semiconductor layer Act. The barrier layer may include an inorganic material such as oxide and/or nitride, and/or an organic material, and/or an organic/inorganic complex, and have a single layer or multilayer structure of an inorganic material and an organic material.

The bias electrode BSM may be on the first buffer layer 111 to correspond to the thin-film transistor TFT. In an embodiment, a voltage may be applied to the bias electrode BSM. In addition, the bias electrode BSM may prevent or reduce penetration of external light to the semiconductor layer Act. Accordingly, the characteristics of the thin-film transistor TFT may be stabilized. The bias electrode BSM may be omitted in some cases.

A semiconductor layer Act may be on the second buffer layer 112. The semiconductor layer Act may include amorphous silicon or poly silicon. In another embodiment, the semiconductor layer Act may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer Act, which is a Zn oxide-based material, may be provided as a Zn oxide material, an In—Zn oxide material, a Ga—In—Zn oxide material, etc. In another embodiment, the semiconductor layer Act may be an IGZO (In—Ga—Zn—O), ITZO (In—Sn—Zn—O), or IGTZO (In—Ga—Sn—Zn—O) semiconductor in which metals such as indium (In), gallium (Ga), stanuum (Sn), etc. are included in ZnO. The semiconductor layer Act may include a channel area, and a source area and a drain area, which are on both sides of the channel area, respectively. The semiconductor layer Act may be configured as a single layer or multi-layer.

The gate electrode GE may be on the semiconductor layer Act with the gate insulating layer 113 therebetween. The gate electrode GE may at least partially overlap the semiconductor layer Act. The gate electrode GE may include molybdenum (Mo), aluminum (Al), copper (Cu), titanium (Ti), etc. and may be configured as a single layer or a multi-layer. For example, the gate electrode GE may include a single layer of Mo. The first electrode CE1 of the storage capacitor Cst may be on the same layer as the gate electrode GE. The first electrode CE1 and the gate electrode GE may include the same material.

Although in FIG. 3, the gate electrode GE of the thin-film transistor TFT is shown to be separated from the first electrode CE1 of the storage capacitor Cst, the storage capacitor Cst may overlap the thin-film transistor TFT. In this case, the gate electrode GE of the TFT may function as the first electrode CE1 of the storage capacitor Cst.

The interlayer insulating layer 115 may be provided to cover the gate electrode GE and the first electrode CE1 of the storage capacitor CST. The interlayer insulating layer 115 may include silicon oxide, silicon nitride, silicon oxynitride, aluminum oxide, titanium oxide, tantalum oxide, hafnium oxide, and/or zinc oxide. The zinc oxide may include zinc oxide (ZnO) and/or zinc peroxide ($ZnO_2$).

The second electrode CE2 of the storage capacitor Cst, the source electrode SE, and the drain electrode DE may be on the interlayer insulating layer 115. The second electrode CE2 of the storage capacitor Cst, the source electrode SE, and the drain electrode DE may include a conductive material (e.g., an electrically conductive material) including molybdenum (Mo), aluminum (Al), copper (Cu), titanium (Ti), etc., and may be configured as a multi-layer or a single layer including the above materials. For example, each of the second electrode SE, the source electrode SE, and the drain electrode DE may have a multi-layer structure of Ti/Al/Ti. The source electrode SE and the drain electrode DE may be connected to the source area or drain area of the semiconductor layer Act through a contact hole.

The second electrode CE2 of the storage capacitor Cst may overlap the first electrode CE1 with the interlayer insulating layer 115 therebetween, and may constitute the storage capacitor Cst. In this case, the interlayer insulating layer 115 may function as a dielectric layer of the storage capacitor Cst.

The planarization layer 118 may be on the second electrode CE2 of the storage capacitor Cst, the source electrode SE, and the drain electrode DE. The planarization layer 118 may be configured as a single layer or multi-layer of an organic material, and may provide a flat upper surface. The planarization layer may include general purpose polymers such as benzocyclobutene (BCB), polyimide, hexamethyldisiloxane (HMDSO), polymethylmethacrylate (PMMA), and/or polystyrene (PS), polymer derivatives having a phenolic group, acrylic polymers, imide-based polymers, arylether-based polymers, amide-based polymers, fluorine-based polymers, p-xylene-based polymers, vinyl alcohol-based polymers, a blend thereof, and/or the like.

The light-emitting device may be on the planarization layer 118. The light-emitting device may include the emission layer 220 and an opposite electrode. In an embodiment, the first organic light-emitting diode OLED1, the second organic light-emitting diode OLED2, and the third organic light-emitting diode OLED3 may be on the planarization layer 118. The first organic light-emitting diode OLED1, the second organic light-emitting diode OLED2, and the third organic light-emitting diode OLED3 may include a first sub-pixel electrode 210R, a second sub-pixel electrode 210G, and a third sub-pixel electrode 210 B, respectively. The first organic light-emitting diode OLED1, the second organic light-emitting diode OLED2, and the third organic light-emitting diode OLED 3 may all include the emission layer 220 and the opposite electrode 230.

The first sub-pixel electrode 210R, the second sub-pixel electrode 210G, and the third sub-pixel electrode 210B may be on the planarization layer 118. The first sub-pixel electrode 210R, the second sub-pixel electrode 210G, and the third sub-pixel electrode 210B may each be connected to the thin-film transistor TFT. The first sub-pixel electrode 210R, the second sub-pixel electrode 210G, and the third sub-pixel electrode 210B may be a (semi-)transmissive or a reflective electrode. In some embodiments, the first sub-pixel electrode 210R, the second sub-pixel electrode 210G, and the third sub-pixel electrode 210B may include a reflective layer including Ag, Mg, Al, Pt, Pd, Au, Ni, Nd, Ir, Cr, and/or a compound thereof, and/or a transparent or semi-transparent electrode layer formed on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first sub-pixel electrode 210R, the second sub-pixel electrode 210G, and the third sub-pixel electrode 210B may include ITO/AG/ITO.

A pixel defining layer 119 may be on the planarization layer 118. The pixel defining layer 119 may include openings that expose the center of each of the first sub-pixel electrode 210R, the second sub-pixel electrode 210G, and the third sub-pixel electrode 210B. The pixel defining layer 119 may cover an edge of each of the first sub-pixel electrode 210R, the second sub-pixel electrode 210G, and the third sub-pixel electrode 210B. The pixel defining layer 119 may increase a distance between the edges of the first sub-pixel electrode 210R, the second sub-pixel electrode 210G, and the third sub-pixel electrode 210B and the opposite electrode 230 above the first sub-pixel electrode 210R, the second sub-pixel electrode 210G, and the third sub-pixel electrode 210B to prevent or reduce occurrence of an arc, etc. at the edges of the first sub-pixel electrode 210R, the second sub-pixel electrode 210G, and the third sub-pixel electrode 210B. The pixel defining layer 119 may include at least one organic insulating material from among polyimide, polyamide, acrylic resin, BCB, and phenolic resin, and may be formed by spin coating and/or the like.

The emission layer 220 of the first organic light-emitting diode OLED1, the second organic light-emitting diode OLED2, and the third organic light-emitting diode OLED3 may include an organic material including fluorescent or phosphorescent material that emits red, green, blue, or white light. The emission layer 220 may include a low molecular organic material and/or a high molecular organic material, and one or more functional layers, such as a hole transport layer (HTL), a hole injection layer (HIL), an electron transport layer (ETL), and/or an electron injection layer (EIL), may be further below and above the emission layer. In FIG. 3, although the emission layer 220 is shown to be formed integrally as a single body across the first sub-pixel electrode 210R, the second sub-pixel electrode 210G, and the third sub-pixel electrode 210, embodiments are not limited thereto, and various suitable changes to the arrangement may be made, for example, the emission layer 220 may correspond to each of the first sub-pixel electrode 210R, the second sub-pixel electrode 210G, and the third sub-pixel electrode 210B.

In an embodiment, the emission layer 220 may be a first-color emission layer. The first-color emission layer may be integrally provided as a single body across the first sub-pixel electrode 210R, the second sub-pixel electrode 210G, and the third sub-pixel electrode 210B, or, when suitable or necessary, may be patterned to correspond to each of the first sub-pixel electrode 210R, the second sub-pixel electrode 210G, and the third sub-pixel electrode 210B. The first-color emission layer may emit light of the first wavelength band, for example, light having a wavelength of 450 nm to 495 nm.

The opposite electrode 230 may be on the emission layer 220 to correspond to the first sub-pixel electrode 210R, the second sub-pixel electrode 210G, and the third sub-pixel electrode 210B. The opposite electrode 230 may be integrally provided as a single body with respect to the plurality of organic light-emitting diodes. In some embodiments, the opposite electrode 330 may be a transparent or semi-transparent electrode, and may be formed of a metal thin film having a small work function including Li, Ca, LiF/Ca, LiF/AI, Al, Ag, Mg, and/or a compound thereof. Furthermore, a transparent conductive oxide (TCO) film of ITO, IZO, ZnO, and/or $In_2O_3$, and/or the like may be further on the metal thin film.

In an embodiment, a first light may be generated in a first emission area EA1 of the first organic light-emitting diode OLED1 and emitted to the outside. The first emission area EA1 may be defined as a portion exposed by the opening of the pixel defining layer 119 of the first sub-pixel electrode 210R. A second light may be generated in a second emission area EA2 of the second organic light-emitting diode OLED1 and emitted to the outside. The second emission area EA2 may be defined as a portion exposed by the opening of the pixel defining layer 119 of the second sub-pixel electrode 210G. A third light may be generated in a third emission area EA3 of the third organic light-emitting diode OLED3 and emitted to the outside. The third emission area EA3 may be defined as a portion exposed by the opening of the pixel defining layer 119 of the third sub-pixel electrode 210B.

The first emission area EA1, the second emission area EA2, and the third emission area EA3 may be apart from each other. Areas of the display area DA excluding the first emission area EA1, the second emission area EA2, and the third emission area EA3 may be non-emission areas. The first emission area EA1, the second emission area EA2, and the third emission area EA3 may be divided by the non-emission areas. In a plan view, the first emission area EA1, the second emission area EA2, and the third emission area EA3 may be in various suitable arrangements such as a striped arrangement and/or a PENTILE® arrangement structure (e.g., an RGBG matrix, RGBG structure, or RGBG matrix structure), etc. PENTILE® is a duly registered trademark of Samsung Display Co., Ltd. In a plan view, the shapes of the first emission area EA1, the second emission area EA2, and the third emission area EA3 may each be one selected from a polygon, a circle, and an oval.

The pixel defining layer 119 may further include a spacer to prevent or reduce damage by a mask. The spacer and the pixel defining layer 119 may be integrally formed as a single body. For example, the spacer and pixel defining layer 119 may be formed concurrently (e.g., simultaneously) through the same process by using a half tone mask process.

The encapsulation layer 300 may be on the light-emitting device and may cover the light-emitting device. Because the first organic light-emitting diode OLED1, the second organic light-emitting diode OLED2, and the third organic light-emitting diode OLED3 may be easily damaged by moisture and/or oxygen from the outside, they may be covered and protected by the encapsulation layer 300. The encapsulation layer 300 may cover the display area DA and may extend to the outside of the display area DA. An encapsulation layer 300 may include at least one organic encapsulation layer and at least one inorganic encapsulation layer. For example, the encapsulation layer 300 may include a first inorganic encapsulation layer 310, an organic encapsulation layer 320, and a second inorganic encapsulation layer 330.

Because the first inorganic encapsulation layer 310 extends along a structure therebelow, the upper surface thereof may not be flat. The organic encapsulation layer 320 covers the first inorganic encapsulation layer 310. In contrast with the first inorganic encapsulation layer 310, the organic encapsulation layer 320 may have an approximately flat upper surface.

The first inorganic encapsulation layer 310 and the second inorganic encapsulation layer 330 may include one or more inorganic materials selected from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and/or polyethylene. In an embodiment, the organic encapsulation layer 320 may include acrylate.

Even when cracks occur in the thin-film encapsulation layer 300 through the above-described multi-layer structure, the encapsulation layer 300 may prevent or reduce connection of such cracks between the first inorganic encapsulation layer 310 and the organic encapsulation layer 320 and/or between the organic encapsulation layer 320 and the second inorganic encapsulation layer 330. Accordingly, the formation of a path through which external moisture and/or oxygen penetrates into the display area DA may be prevented, minimized, or reduced. When suitable or necessary, other layers such as a capping layer may be between the first inorganic encapsulation layer 310 and the opposite electrode 230.

Referring to FIGS. 3 to 5, the color panel 20 may include an upper substrate 400, a color filter layer 500, a first bank 600, a refractive layer RL, a first capping layer CL1, a second bank 700, a functional layer 800, and a second capping layer CL2. The upper substrate 400 may be over the lower substrate 100 with the light-emitting device therebetween. The upper substrate 400 may be over the first organic light-emitting diode OLED1, the second organic light-emitting diode OLED2, and the third organic light-emitting diode OLED3.

The upper substrate 400 may include a central area CA overlapping the light-emitting device. In an embodiment, the central area CA may include a first central area CA1, a second central area CA2, and a third center area CA3. Referring to FIGS. 4A and 4B, the first central area CA1, the second central area CA2, and the third central area CA3 may be apart from each other. Although in FIGS. 4A and 4B, the center of the first central area CA1, the center of the second central area CA2, and the center of the third central area CA3 are at vertices of a virtual triangle, in another embodiment, the first central area CA1, the second central area CA2, and the third central area CA3 may be aligned in parallel (e.g., substantially parallel) in a first direction (e.g., an x direction) and/or a second direction (e.g. a y direction).

The first central area CA1 may overlap the first organic light-emitting diode OLED1 and/or the first emission area EA1. The second central area CA2 may overlap the second organic light-emitting diode OLED2 and/or the second emission area EA2. The third central area CA3 may overlap the third organic light-emitting diode OLED3 and/or the third emission area EA3.

The upper substrate 400 may include a peripheral area PA outside the central area CA. Referring to FIGS. 4A and 4B, the peripheral area PA may surround at least a portion of the central area CA. In an embodiment, the peripheral area PA may entirely surround the central area CA. For example, the peripheral area PA may entirely surround the first central area CA1. For example, the peripheral area PA may entirely surround the second central area CA2. The peripheral area PA may entirely surround the third central area CA3.

The upper substrate 400 may include glass, metal, and/or a polymer resin. When the upper substrate 400 is flexible and/or bendable, the upper substrate 400 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. In an embodiment, the upper substrate 400 may have a multi-layer structure including two layers each including the polymer resin and a barrier layer including inorganic materials such as silicon oxide, silicon nitride, silicon oxynitride, etc. between the two layers.

The color filter layer 500 may be on the lower surface of the upper substrate 400 in a direction from the upper substrate 400 to the lower substrate 100. In the present specification, unless defined otherwise, "upper surface" means a plane in a direction to which an arrow of the z-direction where the x direction crosses the y direction points in the drawing. In addition, "if" means a plane in a direction opposite to the direction to which the arrow of the z-direction points in the drawing. The color filter layer 500 may include a first color filter 510, a second color filter 520, and a third color filter 530. The first color filter 510 may be in the first central area CA1. The second color filter 520 may be in the second central area CA2. The third color filter 530 may be in the third central area CA3. The first color filter 510 may be in contact with the lower surface of the upper substrate 400 in the first central area CA1. The second color filter 520 may be in contact with the lower surface of the upper substrate 400 in the second central area CA2. The third color filter 530 may be in contact with the lower surface of the upper substrate 400 in the third central area CA3. As used herein, the term "contact" may mean direct contact (e.g., physical contact) with no intervening elements between the referenced elements or indirect contact with one or more elements between the referenced elements.

The first color filter 510, the second color filter 520, and the third color filter 530 may be a photosensitive resin material. The first color filter 510, the second color filter 520, and the third color filter 530 may each include a dye and/or a pigment that has an inherent color. The first color filter 510 may transmit light having a wavelength of 630 nm to 780 nm only, the second color filter 520 may transmit light having a wavelength of 495 nm to 570 nm only, and the third color filter may transmit light having a wavelength of 450 nm to 195 nm only.

The color filter layer 500 may reduce external light reflection of the display apparatus 1. For example, when external light reaches the first color filter 510, only light having the wavelength preset as above may transmit the first color filter 510, and light of other wavelengths may be absorbed by the first color filter 510. Therefore, only light having the preset wavelength among external light incident on the display apparatus 1 transmits the first color filter 510 and some of the light is reflected from the opposite electrode 230 and/or the first sub-pixel electrode 210R to be emitted to the outside. Because only some of the external light incident on a location of the first subpixel PX1 is reflected to the outside, external light reflection may be reduced. Such a description may also be applied to the second color filter 520 and the third color filter 530.

The first color filter 510, the second color filter 520, and the third color filter 530 may overlap each other. The first color filter 510, the second color filter 520, and the third color filter 530 may overlap each other between any one selected from the central areas CA and any other one selected from the central areas CA. In other words, the first color filter 510, the second color filter 520, and the third color filter 530 may overlap each other in the peripheral area PA.

For example, the first color filter 510, the second color filter 520, and the third color filter 530 may overlap each other between the first central area CA1 and the second central area CA2. In this case, the third color filter 530 may be between the first central area CA1 and the second central area CA2. The first color filter 510 may extend from the first central area CA1 to overlap the third color filter 530. The second color filter 520 may extend from the second central area CA2 to overlap the third color filter 530.

The first color filter 510, the second color filter 520, and the third color filter 530 may overlap each other between the second central area CA2 and the third central area CA3. The first color filter 510 may be between the second central area CA2 and the third central area CA3. The second color filter 520 may extend from the second central area CA2 to overlap the first color filter 510. The third color filter 530 may extend from the third central area CA3 to overlap the first color filter 510.

The first color filter 510, the second color filter 520, and the third color filter 530 may overlap each other between the third central area CA3 and the first central area CA1. The second color filter 520 may be between the third central area CA3 and the first central area CA1. The third color filter 530 may extend from the third central area CA3 to overlap the second color filter 520. The first color filter 510 may extend from the first central area CA1 to overlap the second color filter 520.

The first color filter 510, the second color filter 520, and the third color filter 530 may overlap each other in the peripheral area PA to constitute a light blocking portion BP. Thus, the color filter layer 500 may prevent or reduce color mixing without a separate light blocking member.

In an embodiment, the third color filter 530 may be stacked first on the upper substrate 400. This is because some of the external light incident from the outside of the upper substrate 400 may be absorbed by the third color filter 530 to reduce reflectivity of the display apparatus 1 and light reflected by the third color filter 530 is rarely (or barely) visible to the user.

As described above, the first color filter 510, the second color filter 520, and the third color filter 530 may be stacked and in the peripheral area PA. On the other hand, only one selected from the first color filter 510, the second color filter 520, and the third color filter 530 may be in the central area CA, for example, the center of the central area CA. For example, only the first color filter 510 may be in the center of the first central area CA. Only the second color filter 520 may be in the center of the second central area CA. Only the third color filter 530 may be in the center of the third central area CA. In one or more embodiments, the thicknesses of the color filter layers 500 in the peripheral area PA and the central area CA may be different from each other. The thickness of the color filter layer 500 in the central area CA may be less than the thickness of the color filter layer 500 in the peripheral area PA. For example, as shown in FIG. 5, a thickness d1 of the color filter layer 500 in the first central area CA1 may be less than a thickness d2 of the color filter layer 500 in the peripheral area PA. In one or more embodiments, the color filter layer 500 may have a step structure in which the thicknesses of the color filter layers 500 in the peripheral area PA and the central area CA are different.

The first bank 600 may be on the color filter layer 500. In an embodiment, the first bank 600 may be on the upper substrate 400. The first bank 600 may be on the lower surface of the upper substrate 400 facing the lower substrate 100. The first bank 600 may include an organic material. In an embodiment, the first bank 600 may include a light blocking material to function as a light blocking layer. The light blocking material may include, for example, at least one selected from black pigments, black dyes, black particles, and metal particles. In an embodiment, the first bank 600 may have an optical density (O.D.) of 0.1 or more per membrane having a thickness of 1 μm.

The first bank 600 may have a plurality of openings. In an embodiment, the first bank 600 may include a first central opening. The first central opening may overlap the central area CA. For example, the first-first central opening COP1-1 may overlap the first central area CA1. The first-second opening COP1-2 may overlap the second central area CA2. The first-third opening COP1-3 may overlap the third central area CA3.

In an embodiment, the first bank 600 may include a first peripheral opening. The first peripheral openings may include a plurality of first peripheral openings. The plurality of first peripheral openings may overlap the peripheral area PA. For example, a first-first peripheral opening POP1-1, a first-second peripheral opening POP1-2, and a first-third peripheral opening POP1-3 defined in the first bank 600 may overlap the peripheral area PA. The first-first peripheral opening POP1-1, the first-second peripheral opening POP1-2, and the first-third peripheral opening POP1-3 may overlap the light blocking portion BP. Therefore, even if the first bank 600 includes the first peripheral opening, light may not be transmitted in the peripheral area PA.

Referring to FIG. 4A, various suitable modifications of the shape of the plurality of first peripheral openings, such as a polygon or a circle, may be possible. A plurality of first peripheral openings may surround at least a portion of the first central opening. In FIG. 4A, although the plurality of first peripheral openings are shown to surround a portion of the first-first central opening COP1-1, the first-second central opening COP1-2, and the first-third central opening COP1-3, embodiments are not limited thereto. In some embodiments, the plurality of first peripheral openings may entirely surround the first central opening. For example, the plurality of first peripheral openings may entirely surround the first-first central opening COP1-1. The plurality of first peripheral openings may entirely surround the first-second central opening COP1-2. The plurality of first peripheral openings may entirely surround the first-third central opening COP1-3. In one or more embodiments, the first peripheral opening may be between the first-first central opening COP1-1 and the first-second central opening COP1-2, between the first-second central opening COP1-2 and the first-third central opening COP1-3, and between the first-third central opening COP1-3 and the first-first central opening COP1-1.

A first concave portion surrounded by a body portion of the first bank 600 may be in the central area CA. Here, the body portion of the first bank 600 refers to portions excluding the openings of the first bank 600 and having a certain thickness. The first concave portion may refer to a space in the central area CA from a surface extended from the lower surface of the first bank 600 to the color filter layer 500. In other words, the first concave portion may be formed when a space portion caused by the step structure of the color filter layer 500 in the central area CA and the peripheral area PA overlaps the first central opening of the first bank 600. The first concave portion may be concave in a direction toward the lower surface of the upper substrate 400.

The first bank 600 may be in the peripheral area PA and may include a first-first portion 600*a* and a first-second portion 600*b* having different thicknesses from each other. Referring to FIG. 5, a thickness L2 of the first-second portion 600*b* may be greater than a thickness L1 of the first-first portion 600*a*. In an embodiment, the first-first portion 600*a* may be more adjacent to the central area CA than the first-second portion 600*b*. For example, one side of the first-first portion 600*a* may be an inner surface of the first bank 600, which defines the first central opening.

In an embodiment, the first-second portion 600*b* may be a portion between the first peripheral openings. For example, the first-second portion 600*b* may be between the first-first peripheral opening POP1-1 and the first-second peripheral opening POP1-2. The first-second portion 600*b* may be a portion in which the column spacer CS is arranged. In an embodiment, a width W2 of the first-second portion 600*b* may be greater than a width W1 of the first-first portion 600*a*. When the first-second portion 600*b* in which the column spacer CS is arranged has a relatively larger width than that of the first-first portion 600*a*, loss of the column spacer CS may be prevented or reduced. Although FIGS. 3 and 5 show that the first bank 600 includes one first-second portion 600*b*, embodiments are not limited thereto. The first bank 600 may include a plurality of first-second portions 600*b*.

Referring to FIGS. 3 and 5, the refractive layer RL may be on the color filter layer 500 and the first bank 600. The refractive layer RL may be on the lower surface of the upper substrate 400. The refractive layer RL may be arranged throughout the display area DA. The refractive layer RL may be continuously in the central area CA and the peripheral area PA. The refractive layer RL may be arranged along the shape of the first concave portion in the central area CA. The refractive layer RL may cover the lower surface of the color filter layer 500. In an embodiment, the refractive layer RL may be in contact with the color filter layer 500. For example, the refractive layer RL may be in contact with the lower surface of the first color filter 510 in the first central area CA1. The refractive layer RL may be in contact with the lower surface of the second color filter 520 in the second central area CA2. The refractive layer RL may be in contact with the lower surface of the third color filter 530 in the third central area CA3. In addition, the refractive layer RL may be in contact with the lower surface of the color filter stacked last among the first to third color filters 510, 520, and 530 in the peripheral area PA, for example, the lower surface of the second color filter 520. The refractive layer RL may cover the step structure of the color filter layer 500. The refractive layer RL may cover the lower surface and the side of the first bank 600. In an embodiment, the refractive layer RL may be in direct contact with the lower surface and the side of the first bank 600.

The refractive layer RL may include an organic material. In an embodiment, the refractive index of the refractive layer RL may be less than the refractive index of the color filter layer 500. In an embodiment, the refractive index of the refractive layer RL may be less than the refractive index of the first capping layer CL1. Because the refractive layer RL has a lower refractive index than the first capping layer CL1, some of light transmitting through the first capping layer CL1 from the functional layer 800 to the first bank 600 may be totally reflected at an interface between the refractive layer RL and the first capping layer CL1. Because light totally reflected at the interface between the refractive layer RL and the first capping layer CL1 is transmitted to the functional layer 800 again, color conversion and light-emission efficiency of the display apparatus 1 may be improved.

The first capping layer CL1 may be on the refractive layer RL. The first capping layer CL1 may be on the lower surface of the upper substrate 400. The first capping layer CL1 may be arranged to entirely cover the display area DA. The first capping layer CL1 may be continuously arranged in the central area CA and the peripheral area PA. The first capping layer CL1 may be arranged along the shape of the first concave portion on the refractive layer RL. The first capping layer CL1 may cover the lower surface of the color filter layer 500. The first capping layer CL1 may cover the step structure of the color filter layer 500. In addition, the first capping layer CL1 may cover the lower surface and the side of the first bank 600.

In an embodiment, the first capping layer CL1 may be in direct contact with the refractive layer RL. In an embodiment, the first capping layer CL1 may protect the refractive layer RL. The first capping layer CL1 may prevent or reduce damage or contamination of the refractive layer RL and/or the color filter layer 500 therebelow and the first bank 600 due to penetration of impurities such as moisture and/or air from the outside. In addition, the first capping layer CL1 may first reflect some of light heading toward the first bank 600 in the functional layer 800, at an interface between the functional layer 800 and the first capping layer CL1. Because light reflected at the interface between the functional layer 800 and the first capping layer CL1 is transmitted to the functional layer 800 again, color conversion and light-emission efficiency of the display apparatus 1 may be improved. The first capping layer CL1 may include inorganic materials such as silicon nitride, silicon oxide, and/or silicon oxynitride.

The second bank 700 may be on the first capping layer CL1. The second bank 700 may be over the upper substrate 400. The second bank 700 may be over the lower surface of the upper substrate 400. The second bank 700 may include an organic material. In an embodiment, the second bank 700 may include a liquid repellent material. The liquid repellent material may be coated on the lower surface and the side of the second bank 700. The liquid repellent material of the second bank 700 may include, for example, fluorine, silane, gelling agent, and/or silica, but is not limited thereto. In an embodiment, the second bank 700 may include a base resin, which is an organic material, and scatterers (e.g., light scatterers) dispersed in the base resin. The base resin may be a transmissive material. For example, the base resin may include a polymer resin such as acryl, benzocyclobutene (BCB), and/or hexamethyldisiloxane (HMDSO).

In an embodiment, the second bank 700 may include a transparent base resin and a scatterer (e.g., a light scatterer), while the first bank 600 may include a light blocking material. In this case, light incident on the second bank 700 is not absorbed and is scattered in the functional layer 800 by the scatterer to improve light efficiency and prevent or reduce transmission of color-converted light through the first bank 600 to an adjacent sub-pixel, thereby preventing or reducing color mixing between adjacent sub-pixels.

The second bank 700 may include a plurality of openings. In an embodiment, the second bank 700 may include a second central opening. The second central opening may overlap the central area CA. For example, the second-first central opening COP2-1 may overlap the first central area CA1. The second-second opening COP2-2 may overlap the second central area CA2. The second-third opening COP2-3 may overlap the third central area CA3.

The second central opening of the second bank 700 may overlap the first central opening of the first bank 600. For example, the second-first central opening COP2-1 may overlap the first-first central opening COP1-1 of the first bank 600. The second-second central opening COP2-2 may overlap the first-second central opening COP1-2 of the first bank 600. The second-third central opening COP2-3 may overlap the first-third central opening COP1-3 of the first bank 600.

In an embodiment, the second bank 700 may include a second peripheral opening. The second peripheral opening may include a plurality of second peripheral openings. The plurality of second peripheral openings may overlap the peripheral area PA. For example, a second-first peripheral opening POP2-1, a second-second peripheral opening POP2-2, and a second-third peripheral opening POP2-3 defined in the second bank 700 may overlap the peripheral area PA. The second-first peripheral opening POP2-1, the second-second peripheral opening POP2-2, and the second-third peripheral opening POP2-3 may overlap the light blocking portion BP.

In an embodiment, the second peripheral opening of the second bank 700 may overlap the first peripheral opening of the first bank 600. For example, the second-first peripheral opening POP2-1 may overlap the first-first peripheral opening POP1-1 of the first bank 600. The second-second peripheral opening POP2-2 may overlap the first-second peripheral opening POP1-2 of the first bank 600. The second-third peripheral opening POP2-3 may overlap the first-third peripheral opening POP1-3 of the first bank 600.

Referring to FIG. 4B, various suitable modifications of the shape of the plurality of second peripheral openings, such as a polygon or a circle, may be possible. A plurality of second peripheral openings may surround at least a portion of the second central opening. In FIG. 4B, although the plurality of second peripheral openings are shown to surround a portion of the second-first central opening COP2-1, the second-second central opening COP2-2, and the second-third central opening COP2-3, embodiments are not limited thereto. In some embodiments, the plurality of second peripheral openings may entirely surround the second central opening. For example, the plurality of second peripheral openings may entirely surround the second-first central opening COP2-1. The plurality of second peripheral openings may entirely surround the second-second central opening COP2-2. The plurality of second peripheral openings may entirely surround the second-third central opening COP2-3. In one or more embodiments, the second peripheral opening may be between the second-first central opening COP2-1 and the second-second central opening COP2-2, between the second-second central opening COP2-2 and the second-third central opening COP2-3, and between the second-third central opening COP2-3 and the second-first central opening COP2-1.

The first peripheral opening of the first bank 600 and the second peripheral opening of the second bank 700 may be structures for increasing the reliability of the color panel 20. For example, the functional layer 800 may be formed by an inkjet printing process. When forming the functional layer 800 by discharging ink (e.g., functional layer forming material) to the second central opening of the second bank 700 overlapping the central area CA, even when an inkjet discharge port is not exactly aligned with the second central opening, ink may not remain on the second bank 700 and may flow therearound to the second peripheral opening and the first peripheral opening overlapping the second peripheral opening. In one or more embodiments, the first peripheral opening of the first bank 600 and the second peripheral opening of the second bank 700 may limit the position of the ink discharged in the wrong position.

A second concave portion surrounded by a body portion of the first bank 600 and the second bank 700 may be in the central area CA. Here, the body portion of the second bank 700 refers to portions excluding the openings of the second bank 700 and having a certain thickness. The second concave portion may refer to a space in the central area CA from a surface extended from the lower surface of the second bank 700 to the color filter layer 500. In other words, the second concave portion may be formed when a space portion caused by the step structure of the color filter layer 500 in the central area CA and the peripheral area PA overlaps the first central opening of the first bank 600 and the second central opening of the second bank 700. The second concave portion may be concave in a direction toward the lower surface of the upper substrate 400.

The second bank 700 may be in the peripheral area PA, and may include a second-first portion 700*a* overlapping the first-first portion 600*a* of the first bank 600 and a second-second portion 700*b* overlapping the first-second portion 600*b* of the first bank 600. Referring to FIG. 5, a vertical distance h2 from the lower surface of the upper substrate 400 to the lower surface of the second-second portion 700*b* may be greater than a vertical distance h1 from the lower surface of the upper substrate 400 to the lower surface of the second-first portion 700*a*. The second-second portion 700*b*, which protrudes towards the emission panel 10 more than the second-first portion 700*a*, may function as a column spacer CS. Although FIGS. 3 and 5 show that the second bank 700 includes one second-second portion 700*b*, embodiments are not limited thereto. The second bank 700 may include a plurality of second-second portions 700*b*. In FIG. 4B, the second-second portion 700*b* of the second bank 700 is shown in a rectangular shape, but is not limited thereto. In some embodiments, the second-second portion 700*b* of the second bank 700 may have another polygonal shape, a circular shape, or an oval shape.

The functional layer 800 may be in the second concave portion. The functional layer 800 may be in the first central opening of the first bank 600 and the second central opening of the second bank 700. The functional layer 800 may fill at least a portion of the second concave portion. The functional layer 800 may fill at least a portion of the first central opening of the first bank 600 and the second central opening of the second bank 700. In an embodiment, because the refractive layer RL and the first capping layer CL1 are between the first bank 600 and the second bank 700, the functional layer 800 may be in direct contact with the lower surface of the first capping layer CL1 and the side of the second bank 700. The first bank 600 and the second bank 700 may act as a partition wall to prevent or reduce flow of a functional layer material into other areas other than a target area. The first bank 600 may be between the second bank 700 and the upper substrate 400 and increase the depth of the second concave portion in which the functional layer 800 is arranged.

In an embodiment, the functional layer 800 may include at least one selected from a color conversion material and a scatterer (e.g., a light scatterer). In an embodiment, the color conversion material may be a quantum dot. In an embodiment, the functional layer 800 may include a first quantum dot layer 810, a second quantum dot layer 820, and a transmission layer 830.

The first quantum dot layer 810 may be in the first-first central opening COP1-1 of the first bank 600 and the second-first central opening COP2-1 of the second bank 700. The first quantum dot layer 810 may overlap the first central area CA1. The first quantum dot layer 810 may fill at least a portion of the first-first central opening COP1-1 of the first bank 600 and the second-first central opening COP2-1 of the second bank 700. The first quantum dot layer 810 may overlap the first emission area CA1. The first sub-pixel PX1 may include the first organic light-emitting diode OLED1 and the first quantum dot layer 810.

The first quantum dot layer 810 may convert light of the first wavelength band generated in the emission layer 220 on the first sub-pixel electrode 210R into light of the second wavelength band. For example, when light having a wavelength of 450 nm to 495 nm is generated from the emission layer 220 on the first sub-pixel electrode 210R, the first quantum dot layer 810 may convert the light to light having a wavelength of 630 nm to 780 nm. Therefore, in the first sub-pixel PX1, light having a wavelength of 630 nm to 780 nm may be emitted through the upper substrate 400 to the outside. In an embodiment, the first quantum dot layer 810 may include a first quantum dot QD1, a first scatterer SC1 (e.g., a first light scatterer SC1), and a first base resin BR1. The first quantum dot QD1 and the first scatterer SC1 may be dispersed in the first base resin BR1.

The second quantum dot layer 820 may be in the first-second central opening COP1-2 of the first bank 600 and the second-second central opening COP2-2 of the second bank 700. The second quantum dot layer 820 may overlap the second central area CA2. The second quantum dot layer 820 may fill at least a portion of the first-second central opening COP1-2 of the first bank 600 and the second-second central opening COP2-2 of the second bank 700. The second quantum dot layer 820 may overlap the second emission area EA2. The second sub-pixel PX2 may include the second organic light-emitting diode OLED2 and the second quantum dot layer 820.

The second quantum dot layer 820 may convert light of the first wavelength band generated in the emission layer 220 on the second sub-pixel electrode 210G into light of a third wavelength band. For example, when light having a wavelength of 450 nm to 495 nm is generated from the emission layer 220 on the second sub-pixel electrode 210G, the second quantum dot layer 820 may convert the light to light having a wavelength of 495 nm to 570 nm. Therefore, in the second sub-pixel PX2, light having a wavelength of 495 nm to 570 nm may be emitted through the upper substrate 400 to the outside. In an embodiment, the second quantum dot layer 820 may include a second quantum dot QD2, a second scatterer SC2 (e.g., a second light scatterer SC2), and a second base resin BR2. The second quantum dot QD2 and the second scatterer SC2 may be dispersed in the second base resin BR2.

The transmission layer 830 may be in the first-third central opening COP1-3 of the first bank 600 and the second-third central opening COP2-3 of the second bank 700. The transmission layer 830 may overlap the third central area CA3. The transmission layer 830 may fill at least a portion of the first-second central opening COP1-2 of the first bank 600 and the second-second central opening COP2-2 of the second bank 700. The transmission layer 830 may overlap the third emission area EA3. The third sub-pixel PX3 may include the third organic light-emitting diode OLED3 and the transmission layer 830.

The transmission layer 830 may emit light generated from the emission layer 220 on the third sub-pixel electrode 210B without wavelength conversion. For example, when light having a wavelength of 450 nm to 495 nm is generated in the emission layer 220 on the third sub-pixel electrode 210B, the transmission layer 830 may emit light to the outside without wavelength conversion. In an embodiment, the transmission layer 830 may include a third scatterer SC3 (e.g., a third light scatterer SC3) and a third base resin BR3. The third scatterer SC3 may be dispersed in the third base resin BR3. In an embodiment, the transmission layer 830 may not include a quantum dot.

At least one selected from the first quantum dot QD1 and the second quantum dot QD2 may include a semiconductor material such as cadmium sulfide (CdS), cadmium telluride (CdTe), zinc sulfide (ZnS), indium phosphide (InP), etc. The size of the quantum dot may be several nanometers, and the wavelength of light after conversion may differ according to the size of the quantum dot.

In an embodiment, the core of the quantum dot may be selected from a Group II-VI compound, a Group III-V compound, a Group IV-VI compound, a Group IV element, a Group IV compound, and a combination thereof.

The Group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a combination thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from the group consisting of: a binary compound selected from the group consisting of GaN, GaP, GaAs, GaSb, AlN, AlP, AlAs, AlSb, InN, InP, InAs, InSb, and a combination thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, and a combination thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from the group consisting of: a binary compound selected from the group consisting of SnS, SnSe, SnTe, PbS, PbSe, PbTe, and a combination thereof; a ternary compound selected from the group consisting of SnSeS, SnSeTe, SnSTe, PbSeS, PbSeTe, PbSTe, SnPbS, SnPbSe, SnPbTe, and a combination thereof; and a quaternary compound selected from the group consisting of SnPbSSe, SnPbSeTe, SnPbSTe, and a combination thereof. The Group IV element may be selected from the group consisting of Si, Ge, and a combination thereof. The Group IV compound may be a binary compound selected from the group consisting of SiC, SiGe, and a combination thereof.

In this case, the binary compound, the ternary compound, or the quaternary compound may be present in particles in uniform concentrations or may be present in the same particle in partially non-uniform concentrations. In addition, the quantum dot may have a core/shell structure in which one quantum dot surrounds the other quantum dot. An interface between the core and the shell may have a concentration gradient in which a concentration of an element decreases along a direction toward a center of the shell.

In some embodiments, the quantum dot may have a core-shell structure including a core including the nanostructure described above and a shell surrounding the core. The shell of the quantum dots may serve as a protective layer for preventing or reducing chemical modification and maintaining the semiconductor properties and/or as a charging layer for imparting electrophoretic properties to the quantum dots. The shell may include a layer or layers. An interface between the core and the shell may have a concentration gradient in which a concentration of an element decreases along a direction toward a center of the shell. Examples of the shell of the quantum dots include a metal and/or a non-metal oxide, a semiconductor compound, or a combination thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_{O3}O_4$, NiO, etc. and/or a ternary compound such as $MgAl_2O_4$, $CoFe_2O_4$, $NiFe_2O_4$, $CoMn_2O_4$, etc., but the disclosure is not limited thereto.

For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the disclosure is not limited thereto.

The quantum dots may have a full width of half maximum (FWHM) of an emission wavelength spectrum of about 45 nm or less, for example, about 40 nm or less, for example, about 30 nm or less, and color purity and/or color reproducibility may be improved in this range. In addition, light emitted through such quantum dots is emitted in all (e.g., substantially all) directions, and thus, the wide viewing angle may be improved.

In addition, the shapes of the quantum dots are ones generally used in the field and are not limited, but may be, for example, spherical, pyramidal, multi-arm and/or cubic, nanoparticles, nanotubes, nanowires, nanofibers, and/or nanoplatelet particles.

The quantum dot may adjust the color of light emitted according to the size of the particles, and thus, the quantum dot may have various suitable colors such as blue, red, and green.

The first scatterer SC1, the second scatterer SC2, and the third scatterer SC3 may scatter light to emit more light. The first scatterer SC1, the second scatterer SC2, and the third scatterer SC3 may increase the light-emission efficiency. At least one selected from the first scatterer SC1, the second scatterer SC2, and the third scatterer SC3 may be any suitable material selected from among a metal and a metal oxide to evenly scatter light. For example, at least one selected from the first scatterer SC1, the second scatterer SC2, and the third scatterer SC3 may be at least one selected from $TiO_2$, $ZrO_2$, $Al_2O_3$, $In_2O_3$, ZnO, $SnO_2$, $Sb_2O_3$, and ITO. In addition, at least one selected from the first scatterer SC1, the second scatterer SC2, and the third scatterer SC3 may have a refractive index of 1.5 or more. Therefore, the light-emission efficiency of the functional layer 800 may be improved. In some embodiments, at least one selected from the first scatterer SC1, the second scatterer SC2, and the third scatterer SC3 may be omitted.

The first base resin BR1, the second base resin BR2, and the third base resin BR3 may be a transmissive material. For example, at least one the first base resin BR1, the second base resin BR2, and the third base resin BR3 may include a polymer resin such as acryl, benzocyclobutene (BCB), and/or hexamethyldisiloxane (HMDSO).

Referring to FIGS. 3 and 5, the transmission layer 830 may include the same material as the second bank 700. In an embodiment, the transmission layer 830 may include a liquid repellent material such as the second bank 700. In addition, the base resin and the scatterer included in the second bank 700 may be the same material as the third base resin BR3 and the third scatterer SC3 included in the transmission layer 830, respectively. In an embodiment, the transmission layer 830 and the second bank 700 may be integrally provided as a single body.

The second capping layer CL2 may be on the second bank 700 and the functional layer 800. The second capping layer CL2 may protect the second bank 700 and the functional layer 800. The second capping layer CL2 may prevent or reduce damage to and/or contamination of the second bank 700 and/or the functional layer 800 due to penetration of impurities such as moisture and/or air from the outside. The second capping layer CL2 may include inorganic materials such as silicon nitride, silicon oxide, and/or silicon oxynitride. In some cases, the second capping layer CL2 may be omitted.

The filling layer 30 may be between the emission panel 10 and the color panel 20. In an embodiment, the filling layer 30 may be between the encapsulation layer 300 and the second bank 700. The filling layer 30 may act as a buffer with respect to external pressure. The filling layer 30 may include a filler. In an embodiment, the filling layer 30 may include a thermocurable and/or photocurable filler. The filler may include organic substances such as methyl silicone, phenyl silicone, and/or polyimide. However, embodiments are not limited thereto, and the filler may include organic sealants such as urethane-based resin, an epoxy-based resin, and/or acrylic resin, an inorganic sealant, and/or a silicone.

The filling layer 30 may fill at least a portion of the first peripheral opening of the first bank 600 and the second peripheral opening of the second bank 700, both openings in which the functional layer 800 is not arranged. For example, the filling layer may fill at least a portion of the first-first peripheral opening POP1-1 of the first bank 600 and the second-first peripheral opening POP2-1 of the second bank 700. The filling layer 30 may fill at least a portion of the first-second peripheral opening POP1-2 of the first bank 600 and the second-second peripheral opening POP2-2 of the second bank 700. The filling layer 30 may fill at least a portion of the first-third peripheral opening POP1-3 of the first bank 600 and the second-third peripheral opening POP2-3 of the second bank 700.

The color panel 20 may include a column spacer CS. The column spacer CS may correspond to the second-second portion 700*b* of the second bank 700. The second-second portion 700*b* may face the lower substrate 100. The second-second portion 700*b* may separate the encapsulation layer 300 from the second-first portion 800*a* of the second bank 700. In an embodiment, the second-second portion 700*b* may penetrate through the filling layer 30 as shown in FIG. 3.

FIGS. 6A, 6B, 6C, 6D, and 6E are cross-sectional views showing a method of manufacturing the display apparatus of FIG. 3.

Figure 6A:
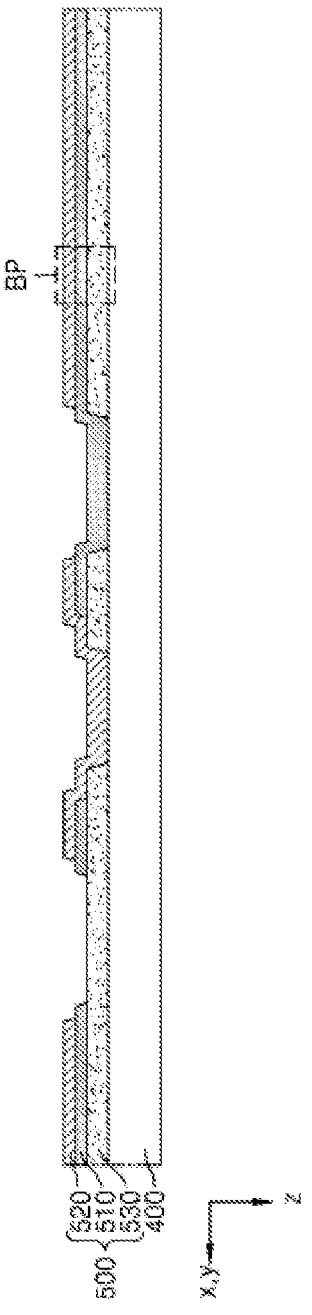
FIGS. 6A-6E are cross-sectional views showing a method of manufacturing the display apparatus of FIG. 3.

Referring to FIG. 6A, in color panel being manufactured, the color filter layer 500 may be on the upper substrate 400. The color filter layer 500 may include a first color filter 510, a second color filter 520, and a third color filter 530 that transmits light having different wavelength bands from each other. The first color filter 510, the second color filter 520, and the third color filter 530 may have different patterns from each other. The color filter layer 500 may be formed using first to third masks having different patterns from each other. For example, the third color filter 530 may be formed on the upper substrate 400 by using the first mask. Then, the first color filter 510 may be formed using the second mask, and the second color filter 520 may be formed using the third mask. The first color filter 510, the second color filter 520, and the third color filter 530 may overlap each other to constitute a light blocking portion BP. Thus, the color filter layer 500 may prevent or reduce transmission of light through the light blocking portion BP without a separate light blocking member.

Figure 6B:
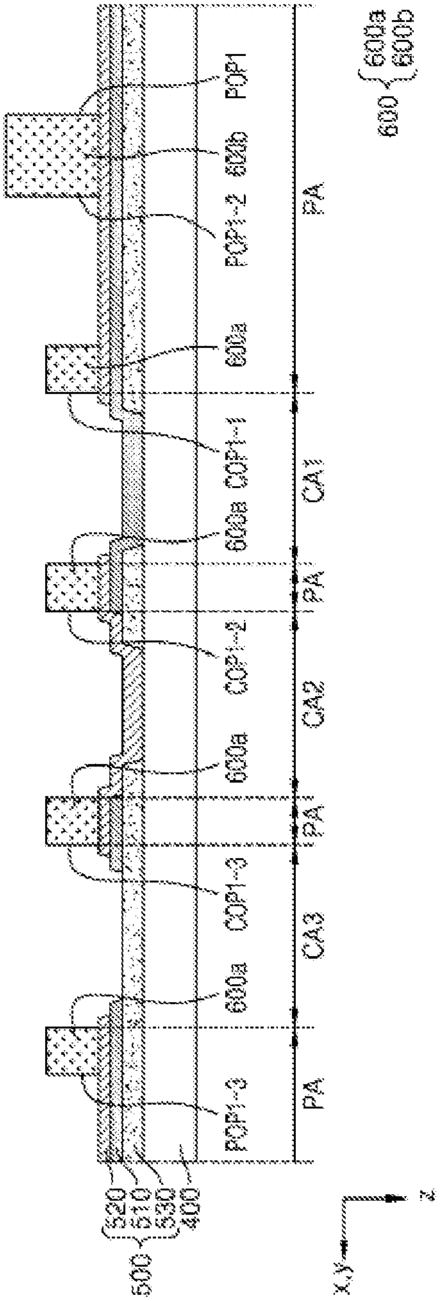

Referring to FIG. 6B, the first bank 600 may be on the color filter layer 500. The first bank 600 may include the first central opening and the first peripheral opening. For example, the first bank 600 may include the first-first central opening COP1-1, the first-second central opening COP1-2, and the first-third central opening COP1-3. The first bank 600 may include the first-first peripheral opening POP1-1, the first-second peripheral opening POP1-2, and the first-third peripheral opening POP1-3. The first bank 600 may include the first-first portion 600*a* and the first-second portion 600*b* having different thicknesses from each other. The thickness of the first-second portion 600*b* of the first bank 600 may be greater than the thickness of the first-first portion 600*a* of the first bank 600.

A fourth mask may be used to form the first bank 600, and a photolithography process may be used. The first bank 600 may first be formed through placing a preliminary first layer on the upper substrate 400 and the color filter layer 500 and then performing exposing, developing, and curing processes thereon. The fourth mask may be used in the exposing process. In an embodiment, the fourth mask may be a half tone mask. The fourth mask may include a light blocking portion, a semi-transmissive portion, and a transmissive portion. The light blocking portion may not transmit most of light, and the semi-transmissive portion may transmit some light. The light transmittance of the transmissive portion may be greater than the light transmittance of the semi-transmissive portion. Because the amount of the preliminary first layer removed in a development process differs according to the amount of exposure, the first bank 600 having different thicknesses may be formed at once. In an embodiment, when the preliminary first layer includes a positive type photoresist (e.g., a positive kind of photoresist), a portion exposed by the light blocking portion of the fourth mask may correspond to the first-second portion 600*b* of the first bank 600, a portion exposed by the semi-transmissive portion may correspond to the first-first portion 600*a* of the first bank 600, and a portion exposed by the transmissive portion may correspond to the opening of the first bank 600. In some embodiments, the preliminary first layer may include a negative type photoresist (e.g., a negative kind of photoresist). In this case, as opposed to the case in which the preliminary first layer includes the positive type photoresist (e.g., a negative kind of photoresist), the exposed portion may remain after the development process.

Figure 6C:
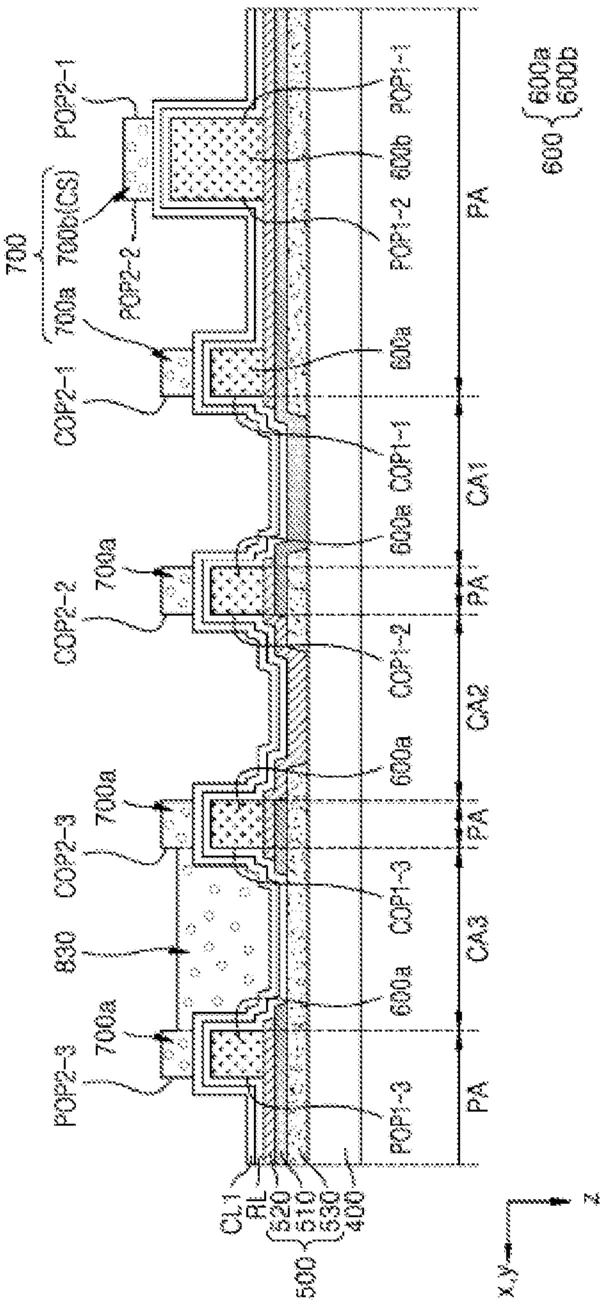

Referring to FIG. 6C, the refractive layer RL and the first capping layer CL1 may be formed sequentially on the first bank 600. Thereafter, the second bank 700 and the transmission layer 830 of the functional layer 800 may be formed on the first capping layer CL1. The second bank 700 may include the second central opening and the second peripheral opening. For example, the second bank 700 may include the second-first central opening COP2-1, the second-second central opening COP2-2, and the second-third central opening COP2-3. The second bank 700 may include the second-first peripheral opening POP2-1, the second-second peripheral opening POP2-2, and the second-third peripheral opening POP2-3. The second bank 700 may include the second-first portion 700*a* and the second-second portion 700*b* overlapping the first-first portion 600*a* and the first-second portion 600*b* of the first bank 600, respectively. The second-second portion 700*b* may correspond to the column spacer CS.

The transmission layer 830 may be formed on the second concave portion overlapping the third central area CA3. The transmission layer 830 may fill at least a portion of the second concave portion overlapping the third central area CA3. The transmission layer 830 may fill at least a portion of the first-third central opening COP1-3 of the first bank 600 and the second-third central opening COP2-3 of the second bank 700.

In an embodiment, a fifth mask may be used in forming the second bank 700 and the transmission layer 830 by using a photolithograpy process. The second bank 700 and the transmission layer 830 may first be formed through placing a preliminary second layer on the upper substrate 400 and the color filter layer 500 and then performing exposing, developing, and curing processes thereon. The fifth mask may be used in the exposing process. The second bank 700 and the transmission layer 830 may include the same material.

In an embodiment, the second bank 700, the column spacer CS (e.g., the second-second portion 700*b* of the second bank 700), and the transmission layer 830 may be patterned by using a mask. Accordingly, not only may the manufacturing cost be reduced, but also the number of processes and manufacturing time may be reduced, thereby increasing production.

Figure 6D:
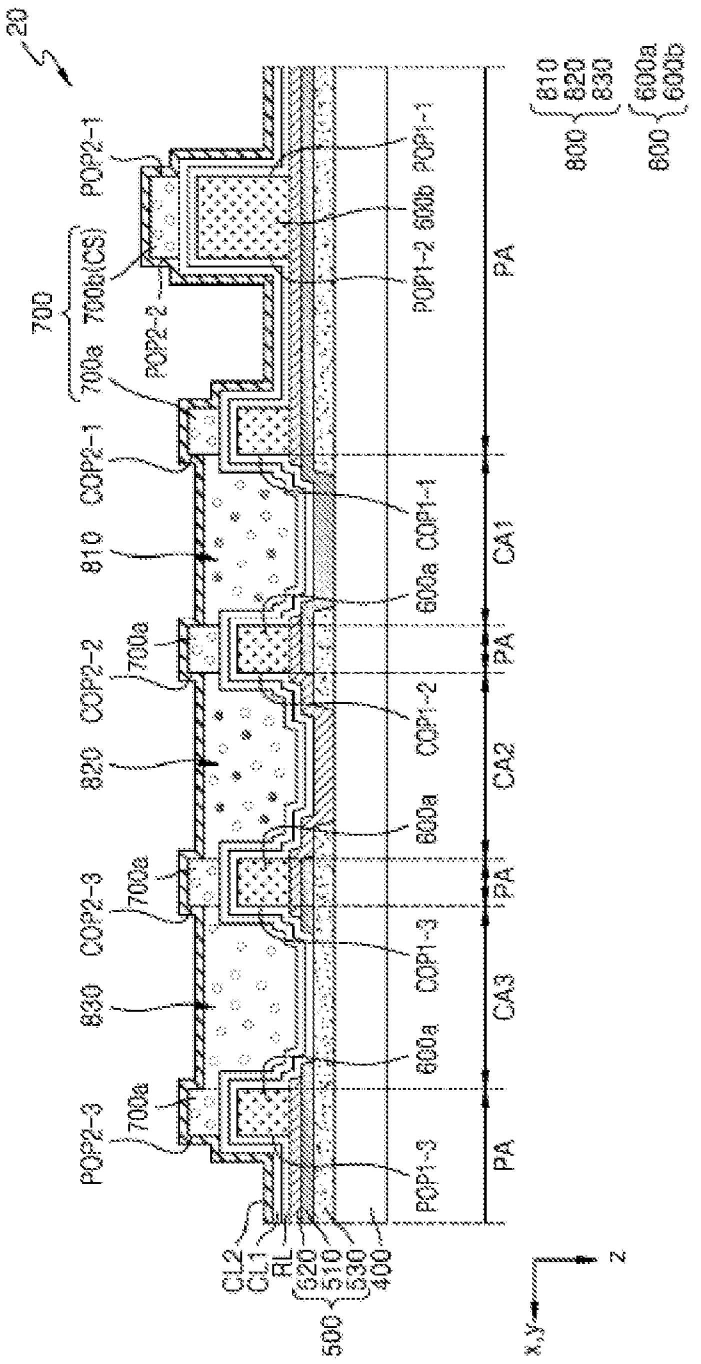

Referring to FIG. 6D, the first quantum dot layer 810 and the second quantum dot layer 820 of the functional layer 800 may be formed on the structure of FIG. 6C. The first quantum dot layer 810 and the second quantum dot layer 820 may fill at least a portion of the second concave portion overlapping the first central area CA1 and the second central area CA2, respectively by the inkjet printing process.

The first quantum dot layer 810 may fill at least a portion of the first-first central opening COP1-1 of the first bank 600 and the second-first central opening COP2-1 of the second bank 700. The second quantum dot layer 820 may fill at least a portion of the first-second central opening COP1-2 of the first bank 600 and the second-second central opening COP2-2 of the second bank 700.

Because the second bank 700 includes a liquid repellent material, in the process of inkjet printing the first quantum dot layer 810 and the second quantum dot layer 820, even when the inkjet discharge port is not exactly aligned with the second concave portion (or the second central opening), a first quantum dot forming material and a second quantum dot forming material may not remain on the second bank 700 and may flow to the second concave portion (or the second central area) corresponding to first central area CA1 and the second concave portion (or the second central opening) corresponding to the second central area CA2, respectively.

Thereafter, the second capping layer CL2 may be on the functional layer 800 and the second bank 700.

Figure 6E:
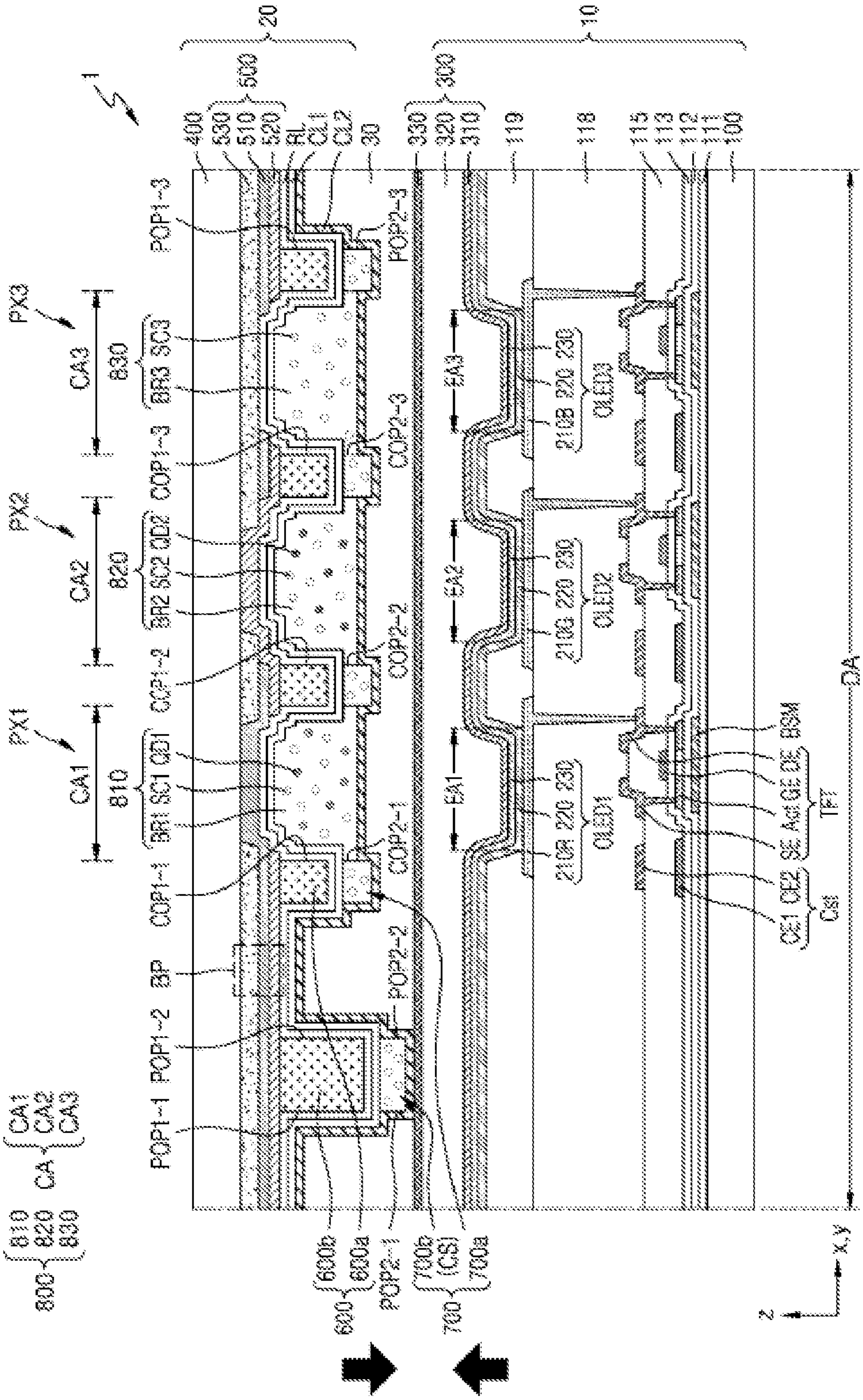

Referring to FIG. 6E, the color panel 20 of FIG. 6D may be bound to the emission panel 10 through the filling layer 30 to produce a display apparatus 1. The filling layer 30 may be between the emission panel 10 and the color panel 20. The filling layer 30 may be between the encapsulation layer 300 and the second bank 700 (or the second capping layer CL2). The second-second portion 700*b* of the second bank 700 corresponding to the column spacer CS may face the encapsulation layer 300. In an embodiment, the second-second portion 700*b* of the second bank 700 may separate the encapsulation layer 300 and the second-first portion 700*a* and may penetrate through the filling layer 30.

Figure 7:
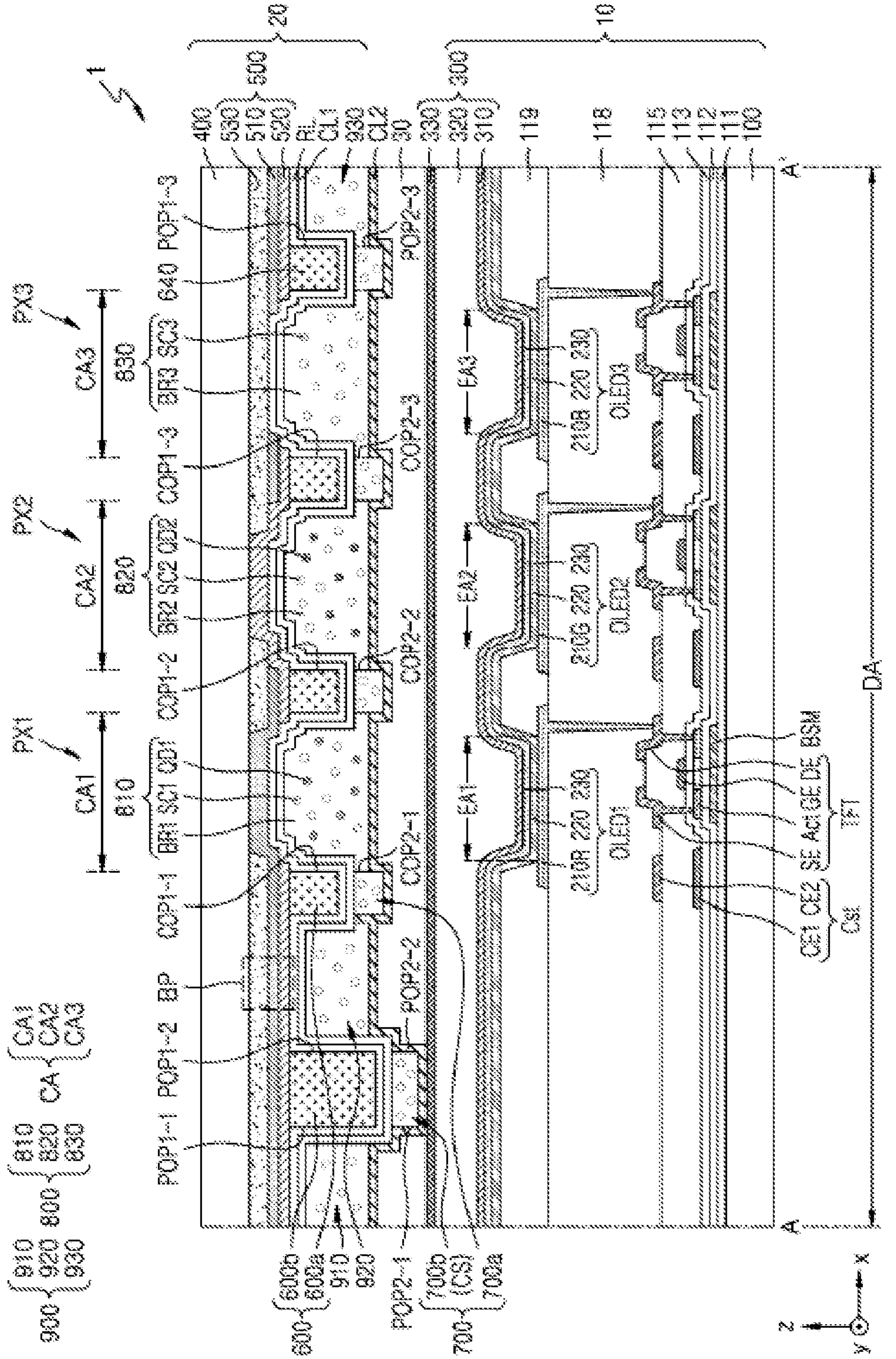
FIG. 7 is a schematic cross-sectional view of a display apparatus according to other embodiments.
Figure 8:
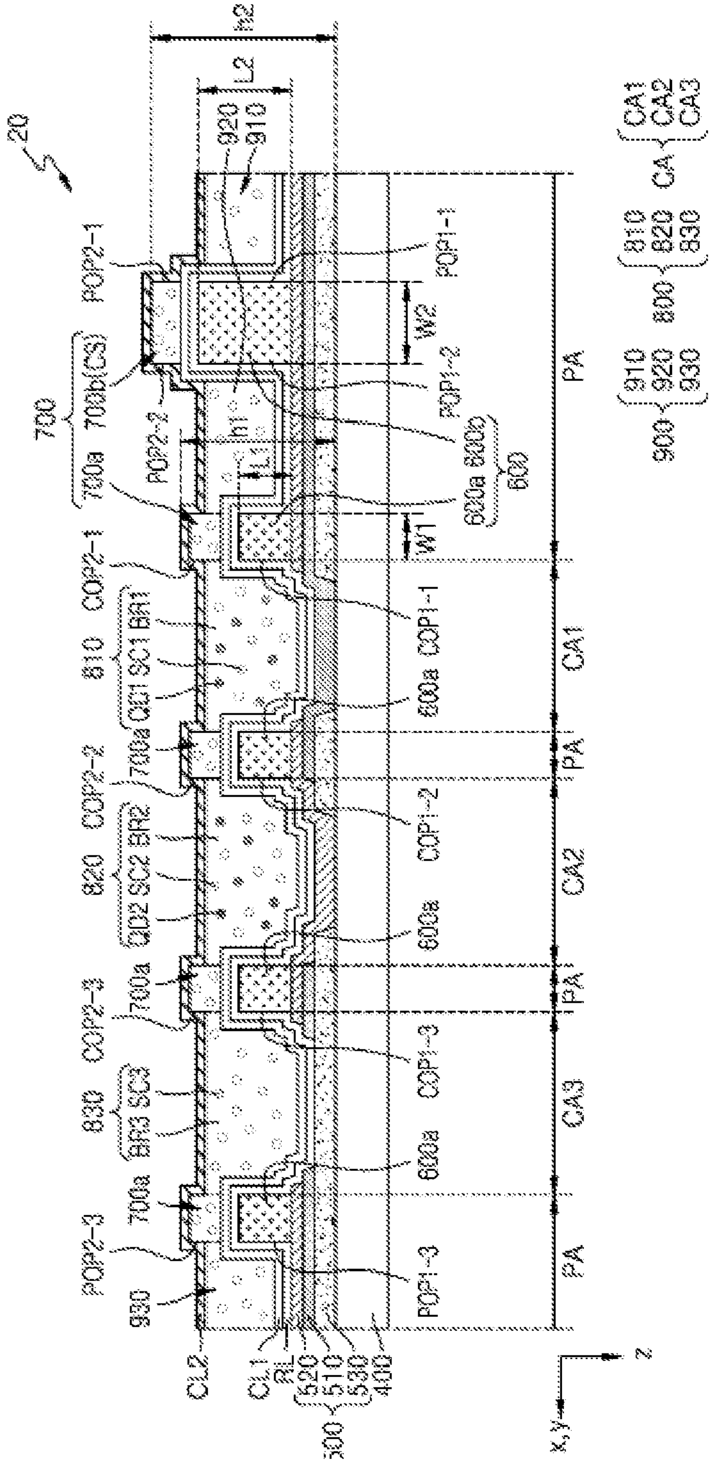
FIG. 8 is a schematic cross-sectional view of a portion of the display apparatus of FIG. 7.

FIG. 7 is a cross-sectional view schematically showing a display apparatus according to another embodiment, and FIG. 8 is a cross-sectional view showing the color panel of FIG. 7. FIGS. 7 and 8, which are modified embodiments of FIGS. 3 and 5, are different from the embodiments described in the configuration of the material layer of the color panel. Hereinafter, descriptions are made focusing on the differences, and redundant descriptions are not repeated here.

Referring to FIGS. 7 and 8, the display apparatus 1 may include the emission panel 10, the color panel 20, and the filling layer 30. The structure of the emission panel 10 may be as described with reference to FIGS. 3 and 5.

The color panel 20 may include the upper substrate 400, the color filter layer 500, the first bank 600, the refractive layer RL, the first capping layer CL1, the second bank 700, the functional layer 800, the second capping layer CL2, and the material layer 900.

The color filter layer 500 may be on the upper substrate 400. The first bank 600 may be on the color filter layer 500. The first bank 600 may include the first central opening overlapping the central area CA. For example, the first bank 600 may include the first-first central opening COP1-1 corresponding to the first central area CA1, the first-second central opening COP1-2 corresponding to the second central area CA2, and the first-third central opening COP1-3 corresponding to the third central area CA3. The first bank 600 may include the first peripheral opening overlapping the peripheral area PA. For example, the second bank 700 may include the first-first peripheral opening POP1-1, the first-second peripheral opening POP1-2, and the first-third peripheral opening POP1-3. The first bank 600 may be in the peripheral area PA and may include a first-first portion **600*a* and a first-second portion 600*b* having different thicknesses from each other. Referring to FIG. 5, the thickness L2 of the first-second portion 600*b* may be greater than the thickness L1 of the first-first portion 600*a***.

The refractive layer RL and the first capping layer CL1 may be sequentially on the refractive layer RL and the first capping layer CL1. The refractive layer RL and the first capping layer CL1 may be arranged throughout the display area DA. The refractive layer RL and the first capping layer CL1 may be continuously in the central area CA and the peripheral area PA, respectively.

The second bank 700 may be on the first capping layer CL1. The second bank 700 may include the second central opening overlapping the central area CA. For example, the second bank 700 may include the second-first central opening COP2-1 corresponding to the first central area CA1, the second-second central opening COP2-2 corresponding to the second central area CA2, and the second-third central opening COP2-3 corresponding to the third central area CA3. The second bank 700 may include the second peripheral opening overlapping the peripheral area PA. For example, the second bank 700 may include the second-first peripheral opening POP2-1, the second-second peripheral opening POP2-2, and the second-third peripheral opening POP2-3.

The second peripheral opening of the second bank 700 may overlap the first peripheral opening of the first bank 600. For example, the second-first peripheral opening POP2-1 may overlap the first-first peripheral opening POP1-1 of the first bank 600. The second-second peripheral opening POP2-2 may overlap the first-second peripheral opening POP1-2 of the first bank 600. The second-third peripheral opening POP2-3 may overlap the first-third peripheral opening POP1-3 of the first bank 600.

A second concave portion surrounded by a body portion of the first bank 600 and the second bank 700 may be in the central area CA. Here, the body portion of the second bank 700 refers to portions excluding the openings of the second bank 700 and having a certain thickness. The second concave portion may refer to a space in the central area CA from a surface extended from the lower surface of the second bank 700 to the color filter layer 500. In other words, the second concave portion may be formed when a space portion caused by the step structure of the color filter layer 500 in the central area CA and the peripheral area PA overlaps the first central opening of the first bank 600 and the second central opening of the second bank 700. The second concave portion may be concave in a direction toward the lower surface of the upper substrate 400.

The second bank 700 may be in the peripheral area PA, and may include a second-first portion **700*a* overlapping the first-first portion 600*a* of the first bank 600 and a second-second portion 700*b* overlapping the first-second portion 600*b* of the first bank 600. Referring to FIG. 8, the vertical distance h2 from the lower surface of the upper substrate 400 to the lower surface of the second-second portion 700*b* may be greater than the vertical distance h1 from the lower surface of the upper substrate 400 to the lower surface of the second-first portion 700*a*. The second-second portion 700*b*, which protrudes towards the emission panel 10 more than the second-first portion 700*a***, may function as the column spacer CS.

The functional layer 800 may be in the second concave portion. The functional layer 800 may be in the first central opening of the first bank 600 and the second central opening of the second bank 700. The functional layer 800 may fill at least a portion of the second concave portion. The functional layer 800 may fill at least a portion of the first central opening of the first bank 600 and the second central opening of the second bank 700. In an embodiment, the functional layer 800 may include the first quantum dot layer 810, the second quantum dot layer 820, and the transmission layer 830.

The material layer 900 may be in the peripheral area PA. The functional layer 900 may be in the first peripheral opening of the first bank 600 and the second peripheral opening of the second bank 700. The first peripheral opening of the first bank 600 may be provided as a plurality of first peripheral openings, and the material layer 900 may be in at least one of the first peripheral openings. In addition, the second peripheral opening of the second bank 700 may be provided as a plurality of second peripheral openings, and the material layer 900 may be in at least one of the second peripheral openings. For example, FIGS. 7 and 8 each show a first material layer 910, a second material layer 920, and a third material layer 930. The first material layer 910 may fill at least a portion of the first-first peripheral opening POP1-1 of the first bank 600 and the second-first peripheral opening POP2-1 of the second bank 700. The second material layer 920 may fill at least a portion of the first-second peripheral opening POP1-2 of the first bank 600 and the second-second peripheral opening POP2-2 of the second bank 700. The third material layer 930 may fill at least a portion of the first-third peripheral opening POP1-3 of the first bank 600 and the second-third peripheral opening POP2-3 of the second bank 700.

Referring to FIGS. 7 and 8, the material layer 900, for example, the first material layer 910, the second material layer 920, and the third material layer 930 may include the same material as the second bank 700 and the transmission layer 830. The material layer 900 may include the same base resin as the third base resin BR3 of the transmission layer 830 and the same scatterer as the third scatterer SC3 of the transmission layer 830. The scatterer may be dispersed in the base resin. In addition, like the second bank 700 and the transmission layer 830, the material layer 900 may include a liquid repellent material. In an embodiment, the material layer 900, the second bank 700, and the transmission layer 830 may be integrally provided as a single body.

The second capping layer CL2 may be on the second bank 700, the functional layer 800, and the material layer 900. The second capping layer CL2 may protect the second bank 700, the functional layer 800, and the material layer 900.

The filling layer 30 may be between the emission panel 10 and the color panel 20. In an embodiment, the filling layer 30 may be between the encapsulation layer 300 and the second bank 700. In an embodiment, the filling layer 30 may fill at least a portion of the first peripheral opening of the first bank 600 and the second peripheral opening of the second bank 700, in which the functional layer 800 and the material layer 900 are not arranged.

In the present embodiment, the display apparatus 1 further includes the material layer 900 in the first peripheral opening of the first bank 600 and the second peripheral opening in the second bank 700, for example, the first material layer 910, the second material layer 920, and the third material layer 930, thereby decreasing the amount of the filler used in manufacturing the display apparatus 1. In addition, the filling layer 30 may have a more uniform (e.g., substantially uniform) thickness in general, and thus, the light-emitting device and the functional layer 800 may be separated by a regular distance.

The manufacturing method described with reference to FIGS. 6A to 6E may be identically applied to a method of manufacturing the display apparatus of FIGS. 7 and 8. However, in the process of preparing the display apparatus 1 of FIGS. 7 and 8, forming the material layer 900 may be performed concurrently (e.g., simultaneously) with forming the second bank 700 and the transmission layer 830 on the first capping layer CL1 shown in FIG. 6C. In one or more embodiments, the second bank 700, the transmission layer 830, the material layer 900, and the column spacer CS (e.g., the second-second portion 700*b* of the second bank 700) may be patterned by using a mask. Accordingly, not only may the manufacturing cost of the display apparatus be reduced, but also the number of manufacturing processes and time may be reduced, thereby increasing production.

While the subject matter of the disclosure has been shown and described with reference to example embodiments thereof, it will be understood by those of ordinary skill in the art that various changes in form and details may be made therein without departing from the spirit and scope of the present disclosure as defined by the following claims, and equivalents thereof.

According to the above embodiments, a display apparatus having improved light efficiency and in which a vivid color is emitted from each sub-pixel may be implemented. However, the scope of the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display apparatus comprising:
a lower substrate;
a light-emitting device over the lower substrate;
an upper substrate over the lower substrate with the light-emitting device therebetween and comprising a central area overlapping the light-emitting device and a peripheral area outside the central area;
a first bank over the upper substrate facing the lower substrate and defining a first opening and a second opening overlapping the central area;
a refractive layer on the first bank;
a transmission layer on the refractive layer and in the first opening;
a quantum dot layer on the refractive layer and in the second opening; and
a second bank over the first bank and the refractive layer in a direction toward the lower substrate and comprising a same material as the transmission layer,
wherein the second bank does not directly contact the first bank, and
wherein the second bank directly contacts the transmission layer or the quantum dot layer.

2. The display apparatus of claim 1, wherein the transmission layer and the second bank are integrally provided as a single body.

3. The display apparatus of claim 1, wherein the first bank comprises a first-first portion in the peripheral area and a first-second portion in the peripheral area, the first-second portion being thicker than the first-first portion.

4. The display apparatus of claim 1, wherein the refractive layer is in contact with each of a lower surface and a side of the first bank.

5. The display apparatus of claim 1, wherein the peripheral area comprises a plurality of peripheral areas and wherein a third opening between adjacent ones of the peripheral areas is defined in the first bank.

6. The display apparatus of claim 1, wherein:
a fourth opening and a fifth opening overlapping the central area are defined in the second bank,
the fourth opening corresponds to the first opening of the first bank, and
the fifth opening corresponds to the second opening of the first bank.

7. The display apparatus of claim 1, wherein the second bank comprises a liquid repellent material.

8. The display apparatus of claim 1, further comprising a first capping layer between the refractive layer and the transmission and quantum dot layers.

9. The display apparatus of claim 1, further comprising a second capping layer on the transmission layer, the quantum dot layer, and the second bank.

10. The display apparatus of claim 3, wherein:
the second bank is in the peripheral area and comprises a second-first portion overlapping the first-first portion of the first bank and a second-second portion overlapping the first-second portion of the first bank, and
a vertical distance from the lower surface of the upper substrate to a lower surface of the second-second portion is greater than a vertical distance from the lower surface of the upper substrate to a lower surface of the second-first portion.

11. The display apparatus of claim 10, further comprising:
an encapsulation layer covering the light-emitting device; and
a filling layer between the encapsulation layer and the second bank, wherein the second-second portion of the second bank separates the encapsulation layer and the second-first portion and penetrates through the filling layer.

12. The display apparatus of claim 5, wherein:
a sixth opening overlapping the peripheral area is defined in the second bank, and the sixth opening corresponds to the third opening of the first bank.

13. The display apparatus of claim 5, further comprising a material layer over the refractive layer and in the third opening of the first bank, wherein the material layer comprises a same material as the second bank.

14. A display apparatus comprising:

a lower substrate;

a light-emitting device over the lower substrate;

an upper substrate over the lower substrate with the light-emitting device therebetween and comprising a central area overlapping the light-emitting device and a peripheral area outside the central area;

a first bank over the upper substrate facing the lower substrate and defining a first opening and a second opening overlapping the central area;

a refractive layer on the first bank;

a transmission layer on the refractive layer and in the first opening;

a quantum dot layer on the refractive layer and in the second opening; and a second bank over the first bank and the refractive layer in a direction toward the lower substrate, wherein the first bank comprises a first-first portion in the peripheral area and a first-second portion in the peripheral area, the first-second portion being thicker than the first-first portion, wherein the second bank does not directly contact the first bank, and wherein the second bank directly contacts the transmission layer or the quantum dot layer.

15. The display apparatus of claim 14, wherein:

the second bank is in the peripheral area and comprises a second-first portion overlapping the first-first portion of the first bank and a second-second portion overlapping the first-second portion of the first bank, and a vertical distance from the lower surface of the upper substrate to a lower surface of the second-second portion is greater than a vertical distance from the lower surface of the upper substrate to a lower surface of the second-first portion.

16. The display apparatus of claim 14, wherein the second bank comprises a same material as the transmission layer.

17. The display apparatus of claim 14, wherein the transmission layer and the second bank are integrally provided as a single body.

18. The display apparatus of claim 14, wherein the peripheral area comprises a plurality of peripheral areas and wherein a third opening between adjacent ones of the peripheral areas is defined in the first bank.

19. The display apparatus of claim 18, further comprising a material layer over the refractive layer and in the third opening of the first bank, wherein the material layer comprises a same material as the second bank.

20. The display apparatus of claim 19, wherein the material layer and the second bank are integrally provided as a single body.

* * * * *